(12) United States Patent
Wang et al.

(10) Patent No.: US 11,048,161 B2
(45) Date of Patent: Jun. 29, 2021

(54) OPTICAL PROXIMITY CORRECTION METHODOLOGY USING PATTERN CLASSIFICATION FOR TARGET PLACEMENT

(71) Applicant: Taiwan Semiconductor Manufacturing Co., Ltd., Hsinchu (TW)

(72) Inventors: Hung-Chun Wang, Taichung (TW); Chi-Ping Liu, Hsinchu (TW); Feng-Ju Chang, Hsinchu (TW); Ching-Hsu Chang, Taipei County (TW); Wen Hao Liu, Hsinchu County (TW); Chia-Feng Yeh, Hsinchu (TW); Ming-Hui Chih, Taipei County (TW); Cheng Kun Tsai, Hsinchu (TW); Wei-Chen Chien, Hsinchu (TW); Wen-Chun Huang, Tainan (TW); Yu-Po Tang, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/727,994

(22) Filed: Dec. 27, 2019

(65) Prior Publication Data

US 2020/0142294 A1    May 7, 2020

Related U.S. Application Data

(63) Continuation of application No. 15/653,784, filed on Jul. 19, 2017, now Pat. No. 10,527,928.

(Continued)

(51) Int. Cl.
*G03F 1/36* (2012.01)
*G06F 30/398* (2020.01)

(52) U.S. Cl.
CPC .............. *G03F 1/36* (2013.01); *G06F 30/398* (2020.01)

(58) Field of Classification Search
USPC .......................................... 716/53
See application file for complete search history.

(56) References Cited

U.S. PATENT DOCUMENTS 6,453,457 B1    9/2002  Pierrat
7,082,596 B2    7/2006  Liu
(Continued)

FOREIGN PATENT DOCUMENTS

WO    WO-2010/005957 A1    1/2010

*Primary Examiner* — Mohammed Alam
(74) *Attorney, Agent, or Firm* — Haynes and Boone, LLP

(57) ABSTRACT

Optical proximity correction (OPC) based computational lithography techniques are disclosed herein for enhancing lithography printability. An exemplary mask optimization method includes receiving an integrated circuit (IC) design layout having an IC pattern; generating target points for a contour corresponding with the IC pattern based on a target placement model, wherein the target placement model is selected based on a classification of the IC pattern; and performing an OPC on the IC pattern using the target points, thereby generating a modified IC design layout. The method can further include fabricating a mask based on the modified IC design layout. The OPC can select an OPC model based on the classification of the IC pattern. The OPC model can weight the target placement model.

20 Claims, 10 Drawing Sheets

Related U.S. Application Data

(60) Provisional application No. 62/436,877, filed on Dec. 20, 2016.

(56) References Cited

U.S. PATENT DOCUMENTS

| | | |
|---|---|---|
| 7,784,019 B1 | 8/2010 | Zach |
| 8,181,128 B2 | 5/2012 | Huang et al. |
| 8,527,916 B1 | 9/2013 | Chiang et al. |
| 8,580,458 B2 | 11/2013 | Futrel et al. |
| 8,589,830 B2 | 11/2013 | Chang et al. |
| 8,762,900 B2 | 6/2014 | Shin et al. |
| 8,796,666 B1 | 8/2014 | Huang et al. |
| 8,812,999 B2 | 8/2014 | Liu et al. |
| 8,832,610 B2 | 9/2014 | Ye et al. |
| 8,850,366 B2 | 9/2014 | Liu et al. |
| 8,906,595 B2 | 12/2014 | Liu et al. |
| 8,910,092 B1 | 12/2014 | Shih et al. |
| 8,938,699 B2 | 1/2015 | Wong et al. |
| 8,954,899 B2 | 2/2015 | Wu et al. |
| 9,093,530 B2 | 4/2015 | Huang et al. |
| 9,165,095 B2 | 10/2015 | Chih et al. |
| 9,367,655 B2 | 6/2016 | Shih et al. |
| 9,390,217 B2 | 7/2016 | Wang et al. |
| 9,548,303 B2 | 7/2017 | Lee et al. |
| 2004/0219436 A1 | 11/2004 | Zhang |
| 2006/0085772 A1 | 4/2006 | Zhang |
| 2009/0077519 A1* | 3/2009 | Hong .................. G03F 1/36 716/119 |
| 2009/0241087 A1 | 9/2009 | Zhang et al. |
| 2013/0275925 A1 | 10/2013 | Wang et al. |
| 2013/0326434 A1 | 12/2013 | Feng |
| 2017/0053055 A1 | 2/2017 | Cheng et al. |
| 2018/0165397 A1 | 6/2018 | Chang et al. |
| 2018/0173090 A1* | 6/2018 | Wang .................. G03F 1/36 |

\* cited by examiner

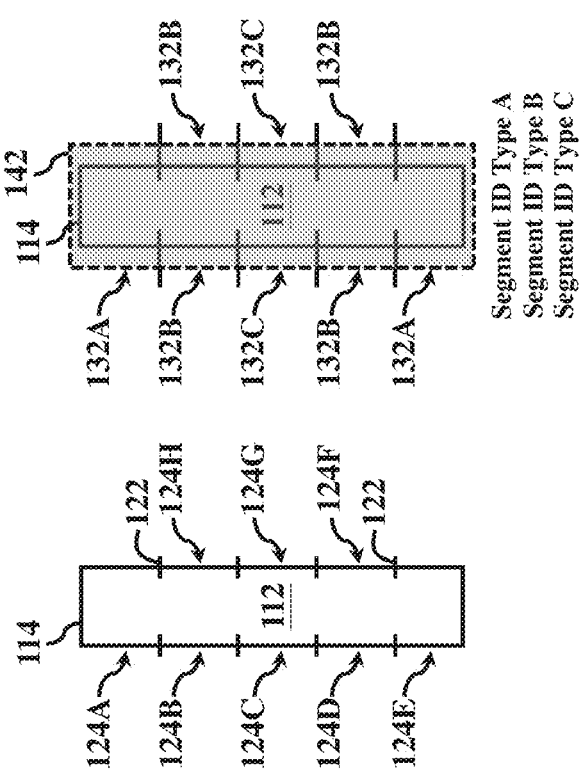
FIG. 3E
FIG. 3D
FIG. 3C
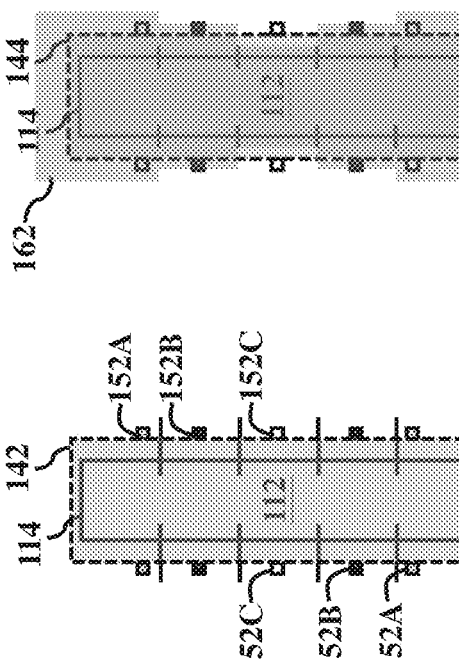
FIG. 3B
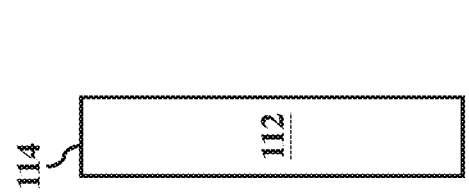
FIG. 3A

OPTICAL PROXIMITY CORRECTION METHODOLOGY USING PATTERN CLASSIFICATION FOR TARGET PLACEMENT

PRIORITY DATA

This application is a continuation application of U.S. patent application Ser. No. 15/653,784, filed Jul. 19, 2017, which is a non-provisional application of claims the benefit of U.S. Provisional Patent Application Ser. No. 62/436,877, filed Dec. 20, 2016, each of which is herein incorporated by reference in its entirety.

BACKGROUND

Integrated circuit (IC) design becomes more challenging as IC technologies continually progress towards smaller feature sizes, such as 32 nanometers, 28 nanometers, 20 nanometers, and below. For example, when fabricating IC devices, IC device performance is seriously influenced by lithography printability capability, which indicates how well a final wafer pattern formed on a wafer corresponds with a target pattern defined by an IC design layout. Various methods that focus on optimizing a mask used for projecting an image that corresponds with the target pattern on the wafer have been introduced for enhancing lithography printability, such as optical proximity correction (OPC), mask proximity correction (MPC), inverse lithography technology (ILT), and source mask optimization (SMO). Although such methods have been generally adequate for their intended purposes, they have not been entirely satisfactory in all respects

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion

FIGS. 3A-3E are schematic diagrammatic top views of an IC pattern undergoing a lithography optimization process, such as the OPC-based computational lithography method of FIG. 2, according to various aspects of the present disclosure.

DETAILED DESCRIPTION

Figure 1:
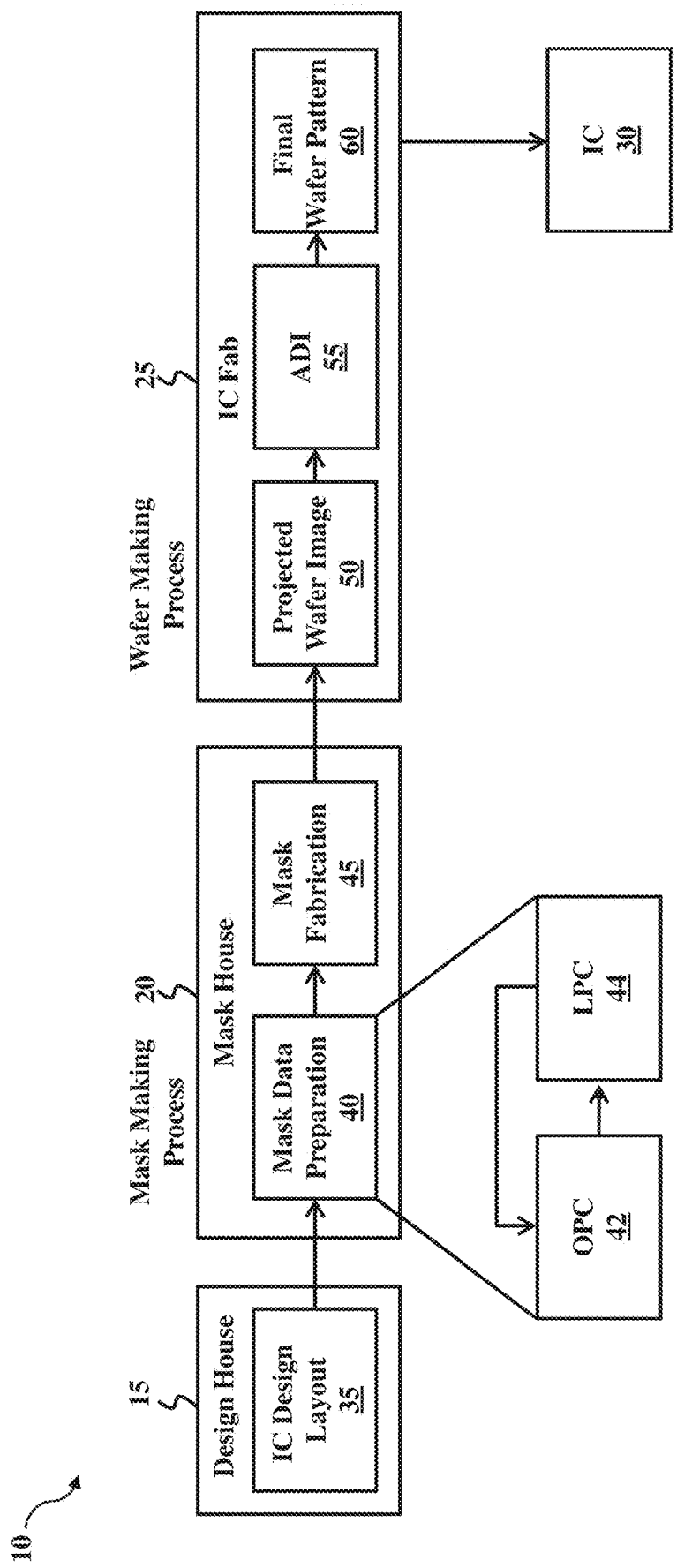
FIG. 1 is a simplified block diagram of an integrated circuit (IC) manufacturing system, along with an IC manufacturing flow associated with the IC manufacturing system, according to various aspects of the present disclosure.

The present disclosure relates generally to lithography optimization techniques, and more particularly, to optical proximity correction (OPC) techniques.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a simplified block diagram of an integrated circuit (IC) manufacturing system 10, along with an IC manufacturing flow associated with IC manufacturing system 10, according to various aspects of the present disclosure. IC manufacturing system 10 includes a plurality of entities, such as a design house (or design team) 15, a mask house 20, and an IC manufacturer 25 (for example, an IC fab), that interact with one another in design, development, and manufacturing cycles and/or services related to manufacturing an IC device 30. The plurality of entities is connected by a communication network, which may be a single network or a variety of different networks, such as an intranet and/or Internet, and may include wired and/or wireless communication channels. Each entity may interact with other entities and may provide services to and/or receive services from the other entities. One or more of design house 15, mask house 20, and IC manufacturer 25 may be owned by a single large company, and may even coexist in a common facility and use common resources.

Design house 15 generates an IC design layout 35 (also referred to as an IC design pattern). IC design layout 35 includes various circuit patterns (represented by geometrical shapes) designed for an IC product based on specifications of an IC product to be manufactured. The circuit patterns correspond to geometrical patterns formed in various material layers (such as metal layers, dielectric layers, and/or semiconductor layers) that combine to form IC features (components) of the IC product, such as IC device 30. For example, a portion of IC design layout 35 includes various IC features to be formed in a substrate (for example, a silicon substrate) and/or in various material layers disposed on the substrate. The various IC features can include an active region, a gate feature (for example, a gate dielectric and/or a gate electrode), a source/drain feature, an interconnection feature, a bonding pad feature, other IC feature, or combinations thereof. In some implementations, assist features are inserted into IC design layout 35 to provide imaging effects, process enhancements, and/or identification information. A geometry proximity correction (GPC) process, similar to an optical proximity correction (OPC) process used for optimizing mask patterns (mask layouts), may generate the assist features based on environmental impacts associated with IC fabrication, including etching loading effects, patterning loading effects, and/or chemical mechanical polishing (CMP) process effects. Design house 15 implements a proper design procedure to form IC design layout 35. The design procedure may include logic design, physical design, place and route, or combinations thereof. IC design layout 35 is presented in one or more data files having information of the circuit patterns (geometrical patterns). For example, IC design layout 35 is expressed in a Graphic Database System file format (such as GDS or GDSII). In another example, IC design layout 35 is expressed in another suitable file format, such as Open Artwork System Interchange Standard file format (such as OASIS or OAS).

Mask house 20 uses IC design layout 35 to manufacture one or more masks, which are used for fabricating various layers of IC device 30 according to IC design layout 35. A mask (also referred to as a photomask or reticle) refers to a patterned substrate used in a lithography process to pattern a wafer, such as a semiconductor wafer. Mask house 20 performs mask data preparation 40, where IC design layout 35 is translated into a form that can be written by a mask writer to generate a mask. For example, IC design layout 35 is translated into machine readable instructions for a mask writer, such as an electron-beam (e-beam) writer. Mask data preparation 40 generates a mask pattern (mask layout) that corresponds with a target pattern defined by the design layout 35. The mask pattern is generated by fracturing the target pattern of IC design layout 35 into a plurality of mask features (mask regions) suitable for a mask making lithography process, such as an e-beam lithography process. The fracturing process is implemented according to various factors, such as IC feature geometry, pattern density differences, and/or critical dimension (CD) differences, and the mask features are defined based on methods implemented by the mask writer for printing mask patterns. In some implementations, where an e-beam writer uses a variable-shaped beam (VSB) method for printing mask patterns, a mask pattern is generated by fracturing IC design layout 35 into polygons (such as rectangles or trapezoids), where a corresponding mask shot map includes exposure shot information for each polygon. For example, at least one corresponding exposure shot, including an exposure dose, an exposure time, and/or an exposure shape, is defined for each polygon. In some implementations, where an e-beam writer uses a character projection (CP) method for printing mask patterns, a mask pattern is generated by fracturing IC design layout 35 into characters (typically representing complex patterns) that correspond with a stencil used by the e-beam writer, where a corresponding mask shot map includes exposure shot information for each character. For example, at least one corresponding exposure shot, including an exposure dose, an exposure time, and/or an exposure shape, is defined for each character. In such implementations, any portions of fractured IC design layout 35 that do not match characters in the stencil can be printed using the VSB method.

Mask data preparation 40 can include various processes for optimizing the mask pattern, such that a final pattern formed on a wafer (often referred to as a final wafer pattern) by a lithography process using a mask fabricated from the mask pattern exhibits enhanced resolution and precision. For example, mask data preparation 40 includes an optical proximity correction (OPC) 42, which uses lithography enhancement techniques to compensate for image distortions and errors, such as those that arise from diffraction, interference, and/or other process effects. OPC 42 can add assist features, such as scattering bars, serifs, and/or hammerheads, to the mask pattern according to optical models or optical rules such that, after a lithography process, a final pattern on a wafer exhibits enhanced resolution and precision. In some implementations, the assist features can compensate for line width differences that arise from different densities of surrounding geometries. In some implementations, the assist features can prevent line end shortening and/or line end rounding. OPC 42 can further correct for e-beam proximity effects and/or perform other optimization features. In some implementations, mask data preparation 40 can implement a mask rule check (MRC) process that checks the mask pattern after undergoing an OPC process, where the MRC process uses a set of mask creation rules. The mask creation rules can define geometric restrictions and/or connectivity restrictions to compensate for variations in IC manufacturing processes. In some implementations, mask data preparation 40 can include a lithography process check (LPC) 44, which simulates wafer making processes that will be implemented by IC manufacturer 25 to fabricate IC device 30. In some implementations, LPC 44 simulates an image of a mask based on a generated mask pattern using various LPC models (or rules), which may be derived from actual processing parameters implemented by IC fab 25. The processing parameters can include parameters associated with various processes of the IC manufacturing cycle, parameters associated with tools used for manufacturing IC device 30, and/or other aspects of the manufacturing process. LPC 44 takes into account various factors, such as image contrast, depth of focus ("DOF"), mask error sensitivity ("MEEF"), other suitable factors, or combinations thereof. After a simulated manufactured device has been created by LPC 44, if the simulated device is not close enough in shape to satisfy design rules, certain steps in mask data preparation 40, such as OPC 42 and MRC, may be repeated to further refine the IC design layout. It should be understood that mask data preparation 40 has been simplified for the purposes of clarity, and mask data preparation 40 can include additional features, processes, and/or operations for modifying the IC design layout to compensate for limitations in lithographic processes used by IC fab 25.

Mask house 20 also performs mask fabrication 45, where a mask is fabricated according to the mask pattern generated by mask data preparation 40. In some implementations, the mask pattern is modified during mask fabrication 45 to comply with a particular mask writer and/or mask manufacturer. During mask fabrication 45, a mask making process is implemented that fabricates a mask based on the mask pattern (mask layout). The mask includes a mask substrate and a patterned mask layer, where the patterned mask layer includes a final (real) mask pattern. The final mask pattern, such as a mask contour, corresponds with the mask pattern (which corresponds with the target pattern provided by IC design layout 35). In some implementations, the mask is a binary mask. In such implementations, according to one example, an opaque material layer (such as chromium) is formed over a transparent mask substrate (such as a fused quartz substrate or calcium fluoride ($CaF_2$)), and the opaque material layer is patterned based on the mask pattern to form a mask having opaque regions and transparent regions. In some implementations, the mask is a phase shift mask (PSM) that can enhance imaging resolution and quality, such as an attenuated PSM or alternating PSM. In such implementations, according to one example, a phase shifting material layer (such as molybdenum silicide (MoSi) or silicon oxide ($SiO_2$)) is formed over a transparent mask substrate (such as a fused quartz substrate or calcium fluoride ($CaF_2$)), and the phase shifting material layer is patterned to form a mask having partially transmitting, phase shifting regions and transmitting regions that form the mask pattern. In another example, the phase shifting material layer is a portion of the transparent mask substrate, such that the mask pattern is formed in the transparent mask substrate. In some implementations, the mask is an extreme ultraviolet (EUV) mask. In such implementations, according to one example, a reflective layer is formed over a substrate, an absorption layer is formed over the reflective layer, and the absorption layer (such as a tantalum boron nitride (TaBN)) is patterned to form a mask having reflective regions that form the mask pattern. The substrate includes a low thermal expansion material (LTEM), such as fused quartz, $TiO_2$ doped $SiO_2$, or other suitable low thermal expansion materials. The reflective layer can include multiple layers formed on the substrate, where the multiple layers include a plurality of film pairs, such as molybdenum-silicide (Mo/Si) film pairs, molybdenum-beryllium (Mo/Be) film pairs, or other suitable material film pairs configured for reflecting EUV radiation (light). The EUV mask may further include a capping layer (such as ruthenium (Ru)) disposed between the reflective layer and the absorption layer. Alternatively, another reflective layer is formed over the reflective layer and patterned to form an EUV phase shift mask.

Mask fabrication 45 can implement various lithography processes for fabricating the mask. For example, the mask making process includes a lithography process, which involves forming a patterned energy-sensitive resist layer on a mask material layer and transferring a pattern defined in the patterned resist layer to the mask patterning layer. The mask material layer is an absorption layer, a phase shifting material layer, an opaque material layer, a portion of a mask substrate, and/or other suitable mask material layer. In some implementations, forming the patterned energy-sensitive resist layer includes forming an energy-sensitive resist layer on the mask material layer (for example, by a spin coating process), performing a charged particle beam exposure process, and performing a developing process. The charged particle beam exposure process directly "writes" a pattern into the energy-sensitive resist layer using a charged particle beam, such as an electron beam or an ion beam. Since the energy-sensitive resist layer is sensitive to charged particle beams, exposed portions of the energy-sensitive resist layer chemically change, and exposed (or non-exposed) portions of the energy-sensitive resist layer are dissolved during the developing process depending on characteristics of the energy-sensitive resist layer and characteristics of a developing solution used in the developing process. After development, the patterned resist layer includes a resist pattern that corresponds with the mask pattern. The resist pattern is then transferred to the mask material layer by any suitable process, such that a final mask pattern is formed in the mask material layer. For example, the mask making process can include performing an etching process that removes portions of the mask material layer, where the etching process uses the patterned energy-sensitive resist layer as an etch mask during the etching process. After the etching process, the lithography process can include removing the patterned energy-sensitive resist layer from the mask material layer, for example, by a resist stripping process.

IC manufacturer 25, such as a semiconductor foundry, uses the mask (or masks) fabricated by mask house 20 to fabricate IC device 30. For example, a wafer making process is implemented that uses a mask to fabricate a portion of IC device 30 on a wafer. In some implementations, IC manufacturer 25 performs wafer making process numerous times using various masks to complete fabrication of IC device 30. Depending on the IC fabrication stage, the wafer can include various material layers and/or IC features (for example, doped features, gate features, source/drain features, and/or interconnect features) when undergoing the wafer making process. The wafer making process includes a lithography process, which involves forming a patterned resist layer on a wafer material layer using a mask, such as the mask fabricated by mask house 20, and transferring a pattern defined in the patterned resist layer to the wafer material layer. The wafer material layer is a dielectric layer, a semiconductor layer, a conductive layer, a portion of a substrate, and/or other suitable wafer material layer.

Forming the patterned resist layer can include forming a resist layer on the wafer material layer (for example, by spin coating), performing a pre-exposure baking process, performing an exposure process using the mask (including mask alignment), performing a post-exposure baking process, and performing a developing process. During the exposure process, the resist layer is exposed to radiation energy (such as ultraviolet (UV) light, deep UV (DUV) light, or extreme UV (EUV) light) using an illumination source, where the mask blocks, transmits, and/or reflects radiation to the resist layer depending on a final mask pattern of the mask and/or mask type (for example, binary mask, phase shift mask, or EUV mask), such that an image is projected onto the resist layer that corresponds with the final mask pattern. This image is referred to herein as a projected wafer image 50. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the final mask pattern. An after development inspection (ADI) 55 can be performed to capture information associated with the resist pattern, such as critical dimension uniformity (CDU) information, overlay information, and/or defect information.

Transferring the resist pattern defined in the patterned resist layer to the wafer material layer is accomplished in numerous ways, such that a final wafer pattern 60 is formed in the wafer material layer. For example, the wafer making process can include performing an implantation process to form various doped regions/features in the wafer material layer, where the patterned resist layer is used as an implantation mask during the implantation process. In another example, the wafer making process can include performing an etching process that removes portions of the wafer material layer, where the etching process uses the patterned resist layer as an etch mask during the etching process. After the implantation process or the etching process, the lithography process includes removing the patterned resist layer from the wafer, for example, by a resist stripping process. In yet another example, the wafer making process can include performing a deposition process that fills openings in the patterned resist layer (formed by the removed portions of the resist layer) with a dielectric material, a semiconductor material, or a conductive material. In such implementations, removing the patterned resist layer leaves a wafer material layer that is patterned with a negative image of the patterned resist layer. An after etch inspection (AEI) is performed to capture information, such as critical dimension uniformity (CDU), associated with the final wafer pattern 60 formed in the wafer material layer.

Ideally, final wafer pattern 60 matches the target pattern defined by IC design layout 35. However, due to various factors associated with the mask making process and the wafer making process, the final mask pattern formed on the mask often varies from the mask pattern (generated from the target pattern defined by IC design layout 35), causing final wafer pattern 60 formed on the wafer to vary from the target pattern. For example, mask writing blur (such as e-beam writing blur) and/or other mask making factors cause variances between the final mask pattern and the mask pattern, which causes variances between final wafer pattern 60 and the target pattern. Various factors associated with the wafer making process (such as resist blur, mask diffraction, projection imaging resolution, acid diffusion, etching bias, and/or other wafer making factors) further exacerbate variances between final wafer pattern 60 and the target pattern. To minimize (or eliminate) such variances, computational lithography has been introduced to enhance and optimize the mask masking process and the wafer making process. Computational lithography generally refers to any technique implementing computationally-intensive physical models and/or empirical models to predict and optimize IC feature patterning, where the physical models and/or the empirical models are based on phenomena that affect lithographic process results, such as imaging effects (for example, diffraction and/or interference) and/or resist chemistry. IC manufacturing system 10 can implement such techniques to generate optimal settings for the mask making process (often referred to as mask optimization) and/or the wafer making process (often referred to as source optimization, wave front engineering, and/or target optimization). For example, IC manufacturing system 10 can implement OPC, MRC, LPC, and/or inverse lithography technology (ILT) techniques to generate a shape for a final mask pattern of a mask fabricated by mask house 20 that optimizes projected wafer image 50, such that projected wafer image 50 corresponds as closely as possible with the target pattern of IC design layout 35.

Figure 2:
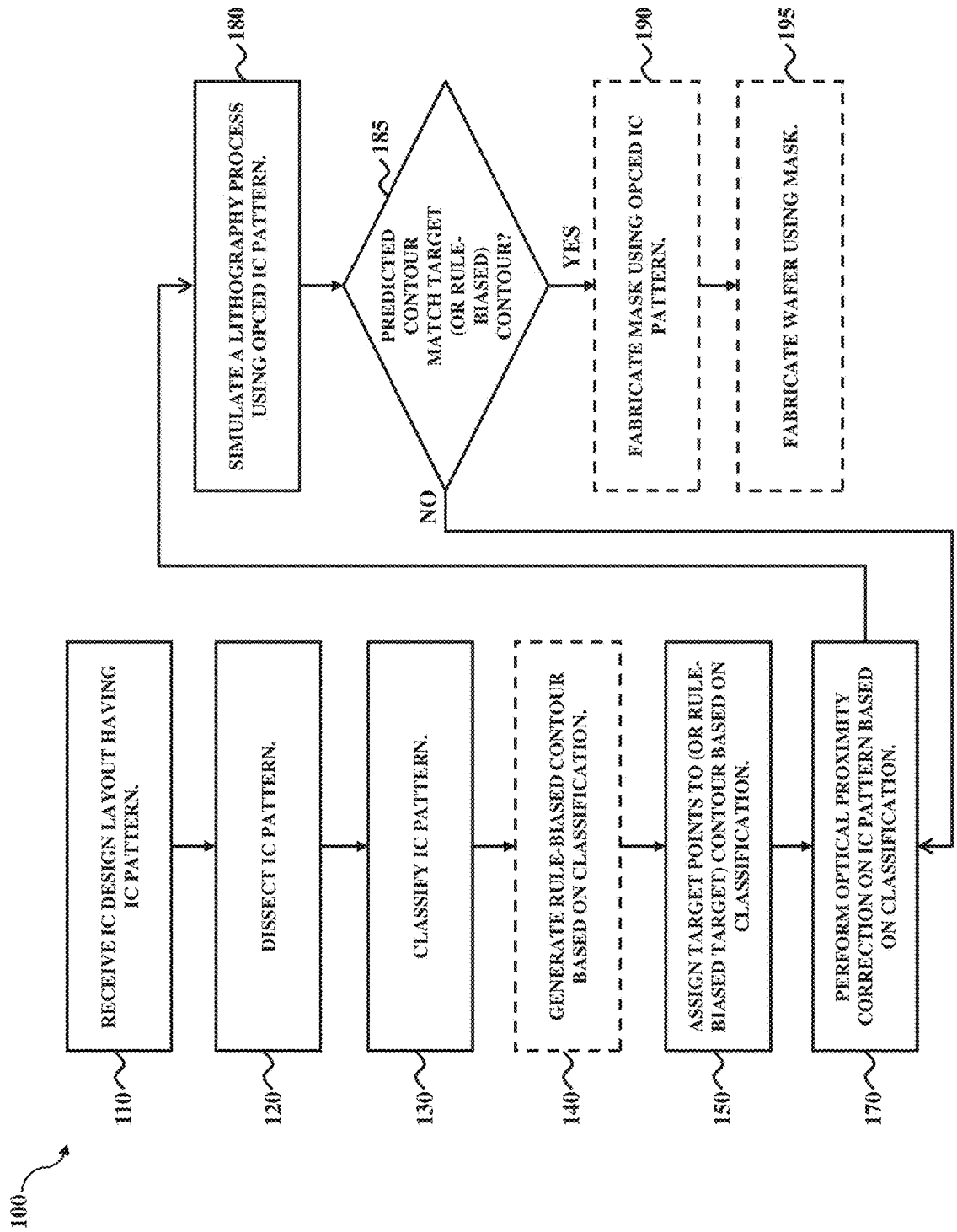
FIG. 2 is a flowchart of an optical proximity correction (OPC) based computational lithography method, which can be implemented by the IC manufacturing system of FIG. 1, according to various aspects of the present disclosure.

FIG. 2 is a flowchart of a computational lithography method 100, which can be implemented by IC manufacturing system 10 of FIG. 1, according to various aspects of the present disclosure. Computational lithography method 100 is an OPC-based computational lithography process, which uses lithography enhancement techniques to compensate for image distortions and errors, such as those that arise from diffraction, interference, or other process effects. Computational lithography method 100 generates a mask pattern (from which a mask can be fabricated) by modifying an IC design layout to compensate for the image distortion and errors. Design house 15, mask house 20, and/or IC manufacturer 25 can perform and/or collaborate to perform computational lithography method 100. In some implementations, mask data preparation 40 of IC manufacturing system 10 implements computational lithography method 100. FIG. 2 has been simplified for the sake of clarity to better understand the inventive concepts of the present disclosure. Additional features can be added in computational lithography method 100, and some of the features described below can be replaced, modified, or eliminated for additional embodiments of computational lithography method 100.

At block 110, computational lithography method 100 includes receiving an IC design layout, such as IC design layout 35, for a target pattern. The IC design layout is presented in one or more data files having information of the target pattern. For example, the IC design layout is received in a GDSII file format or an OASIS file format. The IC design layout includes various IC patterns (represented by geometrical shapes) designed for an IC product based on specifications of an IC product to be manufactured, for example, by IC manufacturing system 10. The IC patterns are formed in various material layers (such as metal layers, dielectric layers, and/or semiconductor layers) that combine to form IC features of the IC product. For example, a portion of the IC design layout includes various IC features to be formed in a wafer (for example, a silicon substrate) and/or in various material layers disposed on the wafer. FIG. 3A is a schematic diagrammatic top view of an IC pattern 112 that can be included in an IC design layout, such as IC design layout 35, according to various aspects of the present disclosure. IC pattern 112 is a geometrical pattern, such as a rectangular pattern, that represents an IC feature, which constitutes a portion of an IC device, such as IC device 30, that is to be formed or defined in a material layer of a wafer. IC pattern 112 can represent an active region, a gate feature (for example, a gate electrode), a source/drain region (or feature), an interconnection feature (for example, a metal interconnect line), a bonding pad feature, or other IC feature. In FIG. 3A, a target (original) contour 114 defines a shape of the IC pattern to be formed on the wafer given ideal lithographic process conditions. Ideally, when a final IC pattern (for example, final wafer pattern 60) corresponding with IC pattern 112 is formed on the wafer, the final IC pattern has a contour that corresponds with target contour 114. In some implementations, a mask includes a mask pattern corresponding with IC pattern 112, such that when exposed to radiation during a lithographic process, a projected wafer image (for example, projected wafer image 50) formed on the wafer corresponds with IC pattern 112 having target contour 114.

Turning again to FIG. 2, at block 120, computational lithography method 100 proceeds with dissecting (fragmenting) at least one IC pattern of the IC design layout. Dissecting involves dividing a target contour of the IC pattern into discrete segments, each of which can be modified independently (for example, with a positive bias or a negative bias) during an OPC process. In some implementations, where the IC design layout includes more than one IC pattern, a target contour of each IC pattern is dissected into discrete segments. FIG. 3B is a schematic diagrammatic top view of an IC pattern, such as IC pattern 112, after undergoing a dissection process according to various aspects of the present disclosure. In FIG. 3B, target contour 114 is divided into segments by dissection (stitching) points 122, such as a segment 124A, a segment 124B, a segment 124C, a segment 124D, a segment 124E, a segment 124F, a segment 124G, and a segment 124H. Target contour 114 is thus divided into eight discrete segments. Each of segments 124A-124H is a portion of target contour 114 defined between adjacent dissection points 122, where the present disclosure contemplates any suitable methodology for placing dissection points 122 along target contour 114.

Turning again to FIG. 2, at block 130, computational lithography method 100 proceeds with classifying the at least one IC pattern of the IC design layout. The classification process defines various IC pattern types (or IC groups) and assigns the IC pattern to at least one of the IC pattern types (or IC groups). For example, the IC pattern is classified by pattern shape, pattern identifier (ID), segment ID, cell type, device type, reference marker, computer-aided drafting (CAD) layer in which the IC pattern resides, fabrication layer in which the IC pattern resides, environment in which the IC pattern resides (for example, an isolated line pattern versus a dense line pattern), other suitable characteristic for defining IC patterns, or combinations thereof. As described in detail below, each IC pattern type will have at least one corresponding target placement rule and at least one corresponding target placement model for defining locations of target points along a contour corresponding with the IC pattern. FIG. 3C is a schematic diagrammatic top view of an IC pattern, such as IC pattern 112, after undergoing a classification process according to various aspects of the present disclosure. In FIG. 3C, the classification process defines various segment types, such as a line segment, a corner segment, a jog segment, a hammerhead segment, a slot segment, other segment type, or combinations thereof. Each segment type has a corresponding segment ID. For example, a Segment ID Type A identifies corner segments, a Segment ID Type B identifies line segments that are disposed between a corner segment and a line segment, and a Segment ID Type C identifies line segments that are disposed between line segments. Based on the defined Segment ID Types, when segments 124A-124H of IC pattern 112 are classified by segment ID, segment 124A and segment 124E are designated as segment type 132A (which corresponds with Segment ID Type A), segment 124B, segment 124D, segment 124F, and segment 124H are designated as segment type 132B (which corresponds with Segment ID Type B), and segment 124C and segment 124G are designated as segment type 132C (which corresponds with Segment ID Type C). Each of segment types 132A-132C will have at least one corresponding target placement rule and at least one corresponding target placement model for defining locations of target points along a contour corresponding with segments of the IC pattern classified as segment types 132A-132C.

Figure 4A:
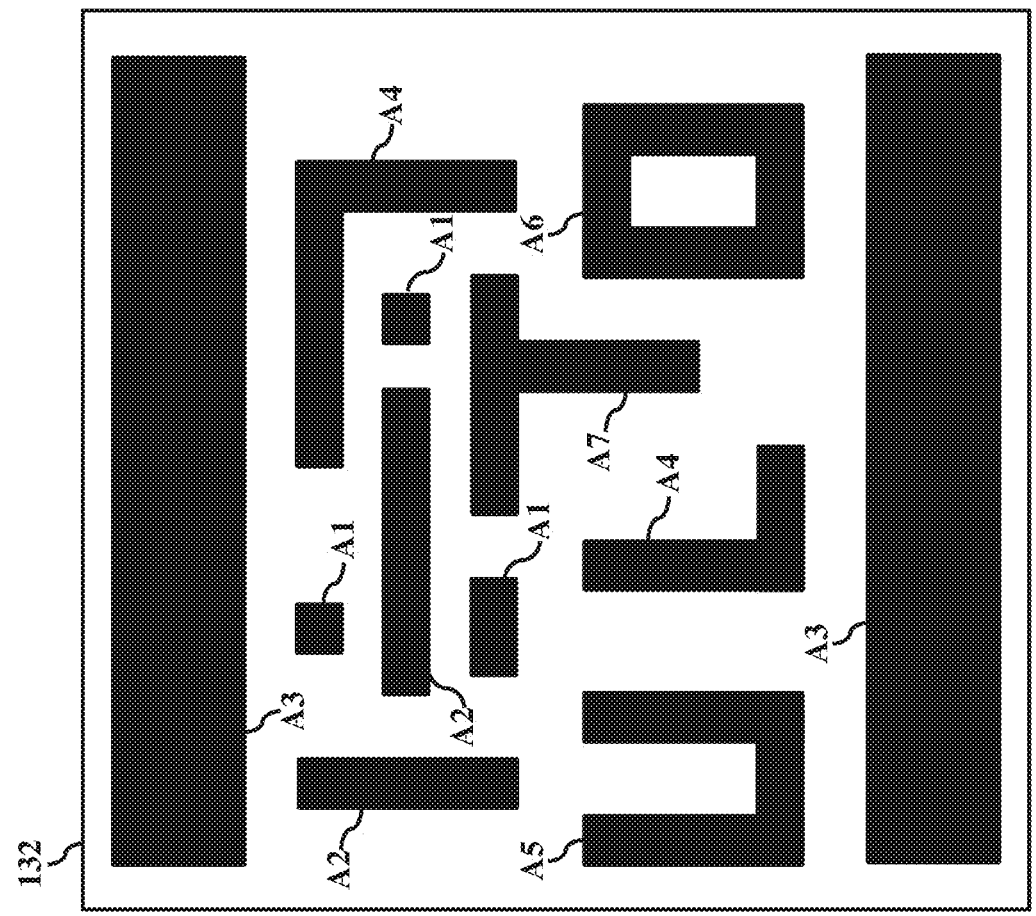
FIGS. 4A-4D are schematic diagrammatic top views of IC design layouts after undergoing a classification process, such as associated with the computational lithography method of FIG. 2, according to various aspects of the present disclosure.

FIGS. 4A-4D are schematic diagrammatic top views of IC design layouts after undergoing a classification process according to various aspects of the present disclosure. In FIG. 4A, an IC design layout 132 includes various IC patterns, where each IC pattern is classified based on a shape of the IC pattern. For example, the various IC patterns are classified as hole-shaped (or island-shaped) patterns A1, line-shaped patterns (for example, small line-shaped patterns A2 and large line-shaped patterns A3 (here, line-shaped patterns can be classified as small or large based on whether a length and/or a width is greater than or less than a threshold length and/or a threshold width)), L-shaped patterns A4, U-shaped patterns A5, O-shaped patterns A6, T-shaped patterns A7, or other shaped patterns. Each of IC shapes A1-A7 will have at least one corresponding target placement rule and at least one corresponding target placement model for defining locations of target points along a contour corresponding with IC patterns classified as IC shapes A1-A7.

Figure 4B:
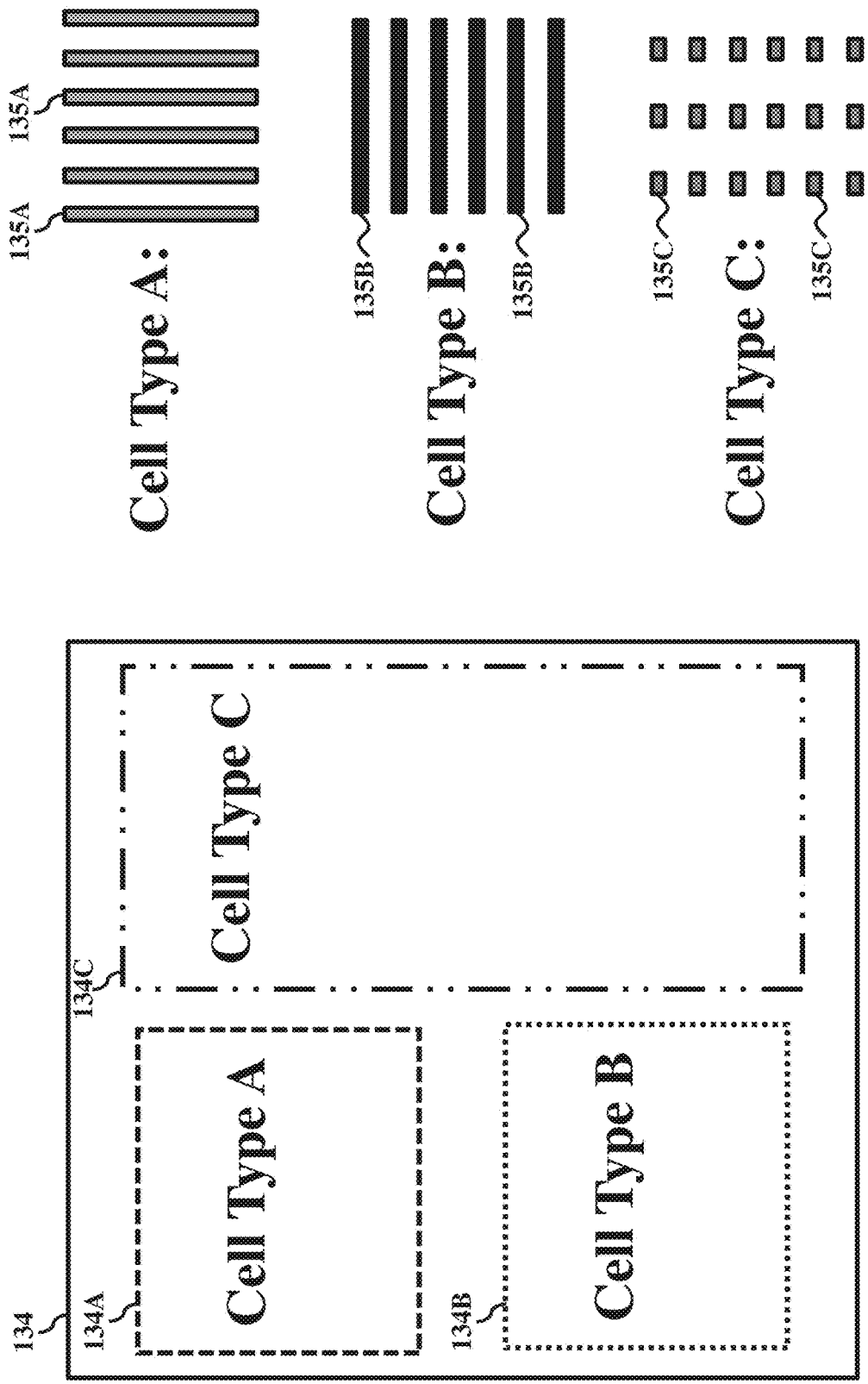

In FIG. 4B, an IC design layout 134 includes various cell types, where each IC pattern is classified based on a cell type to which the IC pattern belongs. Each cell type corresponds with a cell having a defined size and/or a defined function, where a cell generally includes various IC components (for example, transistors, capacitors, resistors, inductors, or other IC components) configured to perform a logic function, a storage function, and/or other function. In some implementations, cell types include a core cell, a scan cell, an input/output (I/O) cell, a memory cell, or other type of cell. In the depicted embodiment, IC design layout 134 includes a Cell Type A region 134A, a Cell Type B region 134B, and a Cell Type C region 134C. IC patterns positioned in Cell Type A region 134A, such as line patterns 135A (extending in a first direction (for example, longitudinally)), are thus classified as Cell Type A patterns, IC patterns positioned in Cell Type B region 134B, such as line patterns 135B (extending in a second direction (for example, latitudinally)), are thus classified as Cell Type B patterns, and IC patterns positioned in Cell Type C region 134C, such as hole patterns 135C, are thus classified as Cell Type C patterns. Each of Cell Types A-C will have at least one corresponding target placement rule and at least one corresponding target placement model for defining locations of target points along a contour corresponding with IC patterns classified as Cell Types A-C.

Figure 4C:
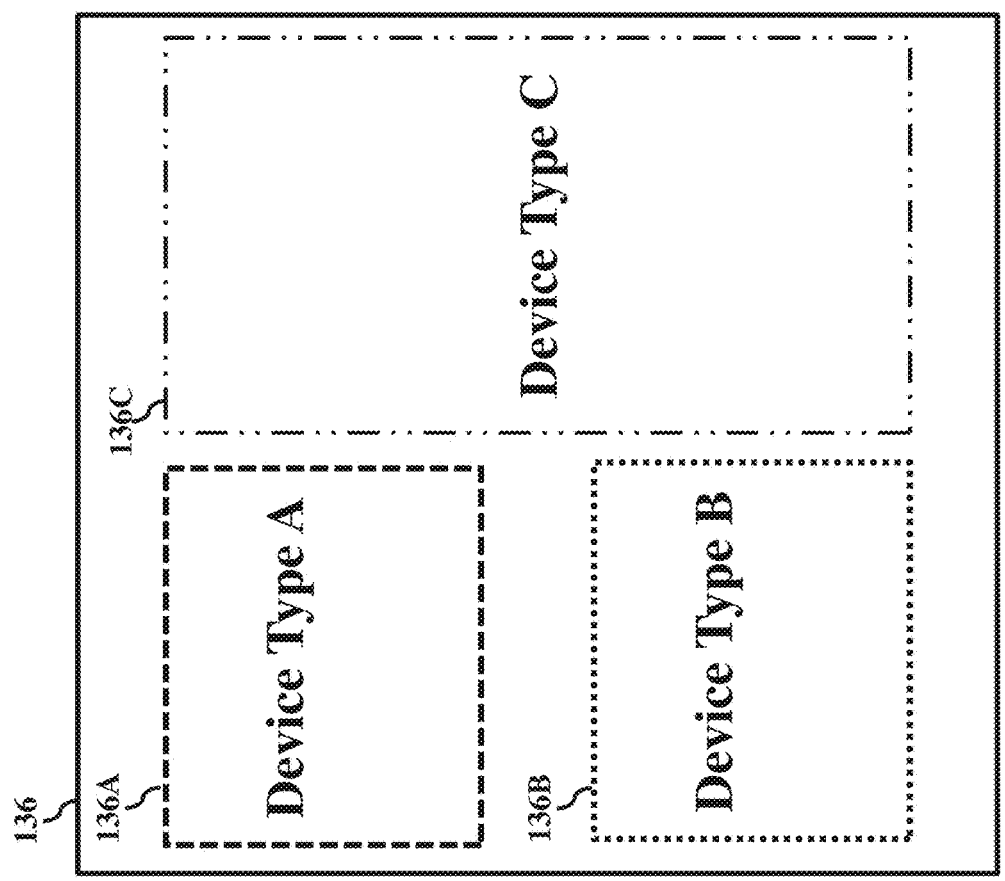

In FIG. 4C, an IC design layout 136 includes various device types, where each IC pattern is classified based on a device type to which the IC pattern belongs. For example, IC design layout 136 includes a Device Type A region 136A (which corresponds with a static random access memory (SRAM)), a Device Type B region 136B (which corresponds with a standard cell), and a Device Type C region 136C (which corresponds with a seal ring). IC patterns positioned in Device Type A region 136A are thus classified as Device Type A patterns, IC patterns positioned in Device Type B region 136B are thus classified as Device Type B patterns, and IC patterns positioned in Device Type C region 136C are thus classified as Device Type C patterns. Each of Device Types A-C will have at least one corresponding target placement rule and at least one corresponding target placement model for defining locations of target points along a contour corresponding with IC patterns classified as Device Types A-C.

Figure 4D:
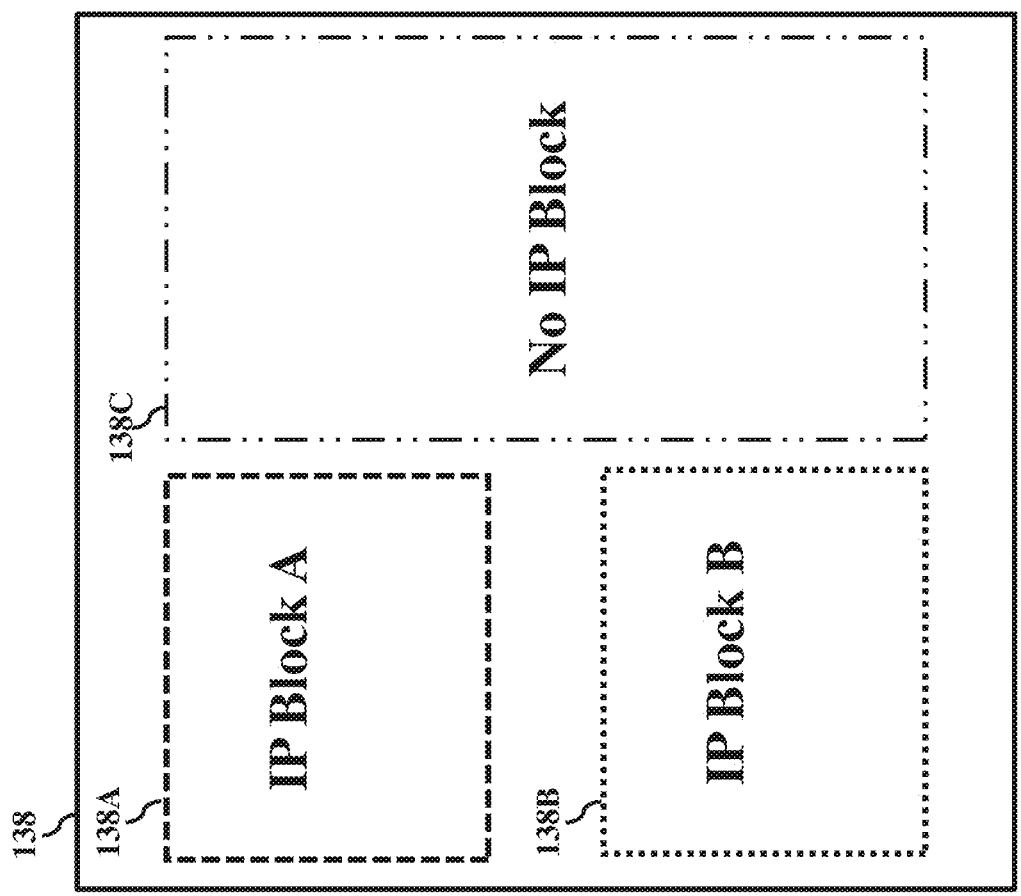

In FIG. 4D, an IC design layout 138 includes various intellectual property (IP) blocks, where each IC pattern is classified based on an IP block to which the IC pattern belongs. An IP block generally refers to a reusable, custom designed logic component, storage component, or other component. For example, IC design layout 138 includes an IP Block A region 138A (which corresponds with an IP Block A), an IP Block B region 138B (which corresponds with an IP Block B), and a No IP Block region 138C (which does not correspond with any particular IP Block). IC patterns positioned in IP Block A region 138A are thus classified as IP Block A patterns, IC patterns positioned in IP Block B region 138B are thus classified as IP Block B patterns, and IC patterns positioned in No IP Block region 138C are thus classified as No IP Block patterns. Each of Block Types A-C will have at least one corresponding target placement rule and at least one corresponding target placement model for defining locations of target points along a contour corresponding with IC patterns classified as Block Types A-C.

Turning again to FIG. 2, since model-based OPC techniques cannot always provide sufficient process windows for advanced technology nodes, in some implementations, at block 140, computational lithography method 100 proceeds with generating a rule-biased contour for the at least one IC pattern based on the classification. Such process is often referred to as rule-based retargeting of the IC design layout, which effectively calibrates any OPC model(s) used during computational lithography method 100. The rule-biased contour can be generated by adjusting (modifying) the target contour according to one or more rules based on the classification(s) of the IC pattern. The rules can compensate for defocus conditions, exposure conditions (energy bias), mask conditions (mask bias) associated with imaging a mask pattern (typically an OPCed IC pattern), etching conditions (etch bias), other conditions, or combinations thereof that may not be captured by the OPC model(s), thereby improving printability of the IC pattern and/or improving process windows (generally referring to a distribution of IC metrics (for example, critical dimension (CD), normalized image log slope (NILS), and/or sensitivity to mask CD errors (Mask Error Enhancement Factor (MEEF)) that will meet IC specification requirements over a range of process conditions). For example, though an isolated line often has a smaller process window than a dense line, it has been observed that increasing a size of the isolated line can enlarge the process window. Accordingly, a rule can define how to modify a target contour of an isolated line to generate a rule-biased contour that results in an enlarged isolated line, thereby improving the process window. In some implementations, computational lithography method 100 can implement a rule table for generating the rule-biased contour. In some implementations, the rule-biased contour is generated by applying a math function and/or logic operation to the target contour. Various math functions that can be implemented include a Hermite polynomial, a Bezier curve, a Lagrange polynomial, a Gaussian function, a divergence function, a Bessel function, other suitable math function, or combinations thereof.

In some implementations, the rule-biased contour is generated by selectively biasing or shifting each segment of the target contour (generated at block 120) based on one or more rules for the classification of the IC pattern. For example, in FIG. 3C, a rule-biased contour 142 is generated for IC pattern 112 by biasing segments 124A-124H according to various rules defined for segment types 132A-132C. Segments 124A-124H are moved outward from their original locations according to the various rules, thereby enlarging a contour of IC pattern 112. Segment 124A and segment 124E are biased based on rules defined for segment type 132A. Segment 124B, segment 124D, segment 124F, and segment 124H are biased based on rules defined for segment type 132B. Segment 124C and segment 124G are biased based on rules defined for segment type 132C. In some implementations, a rule table can store rules for segment type 132A, segment type 132B, and segment type 132C. Alternatively, in some implementations, IC pattern 112 may be classified by pattern shape, such as a small line-shaped pattern or a large line-shaped pattern (see FIG. 4A), where segments 124A-124H are adjusted according to rules defined for the small line-type pattern or the large line-type pattern. In yet another alternative, in some implementations, IC pattern 112 may be classified by a cell, a device, or an IP block to which it belongs in the IC design layout. For example, IC pattern 112 may be classified as an IC pattern that belongs to Cell Type A (see FIG. 4B), Device Type B (see FIG. 4C), or IP Block A (see FIG. 4D), where segments 124A-124H are adjusted according to rules defined for Cell Type A, Device Type B, or IP Block A.

Turning again to FIG. 2, at block 150, computational lithography method 100 proceeds with assigning target points to the target contour (or the rule-biased contour) based on the classification. At least one target point is assigned to each discrete segment, such that target points are spaced at locations along the target contour (or the rule-biased contour). Each IC pattern type has at least one corresponding target placement rule and at least one corresponding target placement model for defining locations of target points along a contour associated with the IC pattern, such as target contour 114 (or rule-biased contour 142) of IC pattern 112. For example, Segment ID Type A, Segment ID Type B, and Segment ID Type C each have at least one corresponding target placement rule and at least one corresponding target placement model for defining locations of target points along a contour corresponding with IC pattern 112 that includes segment types 132A-132C. A target placement model predicts a location of a contour of an IC pattern after undergoing an OPC process (referred to herein as a predicted OPC contour), such that target points can be generated at locations along a contour associated with the IC pattern that better approximate an OPC contour for a particular IC pattern type(s). By placing target points according to a target placement model specific to the particular IC pattern type(s), computational lithography method 100 individually considers environments (including optical related behaviors and/or resist related behaviors) for each IC pattern type, such that target points are optimally placed for each IC pattern type. In some implementations, since different IC pattern types will exhibit different patterning characteristics, dominate model terms (generally referring to model parameters that represent a lithography process response and/or other patterning related response associated with forming an IC pattern on a wafer) will vary depending on IC pattern type. For example, target placement models for simple patterns may require only one or two model terms (for example, Gaussian terms) to accurately predict corresponding lithography behavior, whereas target placement models for complex two-dimensional patterns (which can exhibit large variations) may require more than two (or different) model terms to accurately predict corresponding lithography behavior, for example, to minimize resist residue. Each target placement model can thus optimally predict the best locations for target points for OPC correction for each IC pattern type.

Figure 5:
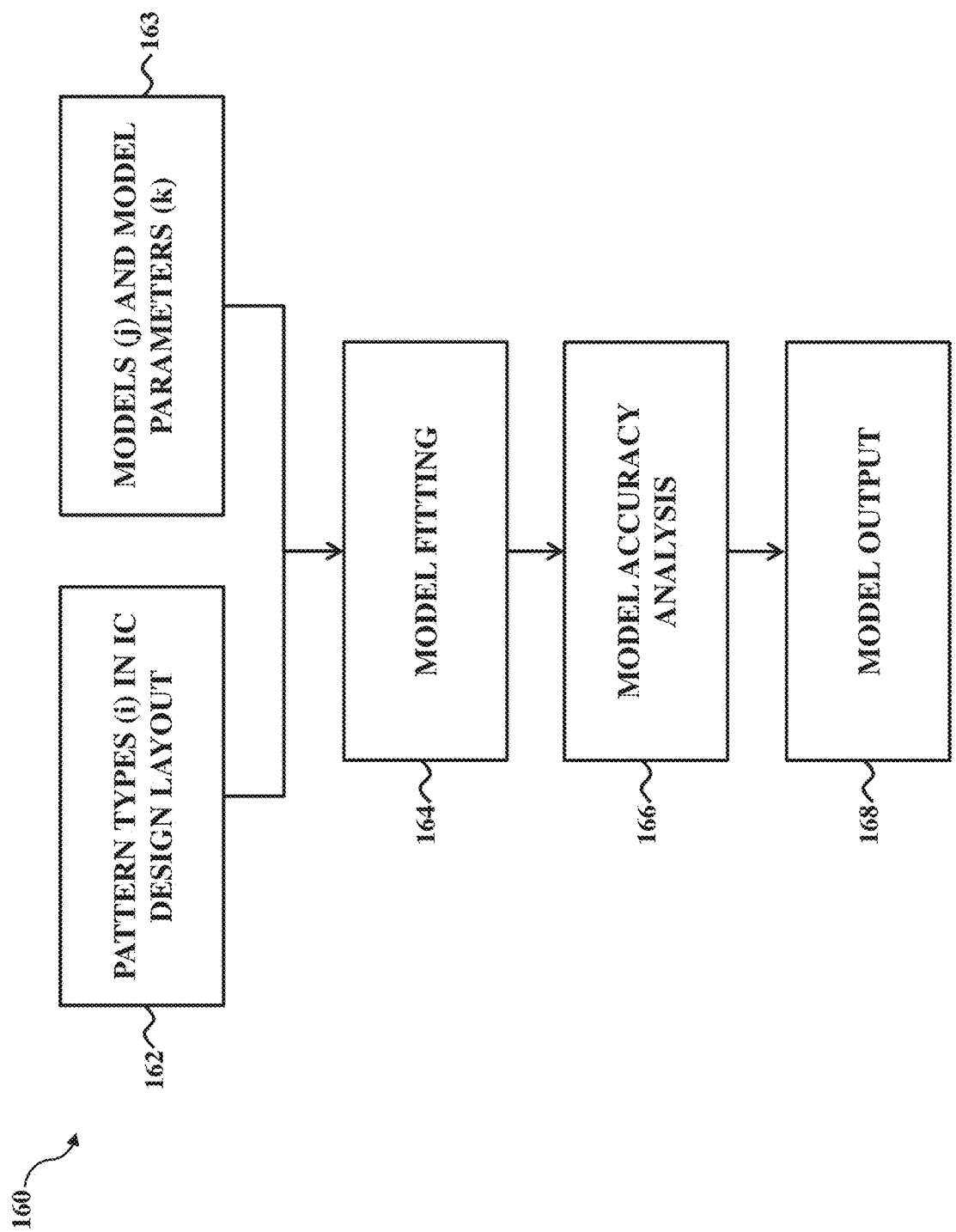
FIG. 5 is a flowchart of a target placement model generation method, which can be implemented during the computational lithography method of FIG. 2, according to various aspects of the present disclosure.

FIG. 5 is a flowchart of a target placement model generation method 160, which can be implemented during computational lithography method 100 of FIG. 2, according to various aspects of the present disclosure. In some implementations, target placement model generation method 160 is implemented at block 150 of computational lithography method 100. At block 162, target placement model generation method 160 identifies IC pattern types (i) classified in an IC design layout, such as IC design layout 35, where the IC design layout includes a number of IC pattern types (n), where i is an integer from 1 to n (for example, i=1, 2, ..., n). In continuation of the example herein, IC pattern 112 is classified by three different IC pattern types, segment types 132A-132C. For purposes of discussion, assuming IC design layout includes only segment types 132A-132C, target placement model generation method 160 identifies three IC pattern types (in other words, n=3 and i=1, 2, 3). At block 163, target placement model generation method 160 identifies models (j), where a number of models (l) can be used for placing target points and j is an integer from 1 to l (for example, j=1, 2, ..., l). Target placement model generation method 160 also identifies model parameters (units) (k) based on the identified pattern types, where m is a number of model parameters and k is an integer from 1 to m (for example, k=1, 2, ..., m). In some implementations, models and/or model parameters are identified based on the IC design layout, the IC device to be fabricated, the identified IC pattern types, an environment associated with the IC design layout and/or identified IC pattern types, other suitable identification criteria, or combinations thereof. In some implementations, each model $F_j(x)$ is represented by:

$$F_j(x) = \sum_{k}^{m} c_k f_k(x) = c_1 f_1(x) + c_2 f_2(x) + \ldots + c_m f_m(x)$$

where $f_k(x)$ represents a mathematical function that is designed to model a particular physical effect and $c_k$ represents a parameter associated with the mathematical function.

At block 164 and block 166, target placement model generation method 160 performs model fitting to generate various models for various IC pattern types and analyzes accuracy of the generated models for the various IC pattern types, such that target placement model generation method 160 can select which models best predicts locations of OPC contours for which IC pattern types. In some implementations, for each model, statistical fitting techniques (or methodologies) are implemented to generate values for parameters ($c_k$). In some implementations, target placement model generation method 160 identifies models and corresponding parameters that minimize (or eliminate) any error, such as a difference, between a predicted OPC contour (as predicted by the model) and a target OPC contour (for example, an OPC contour expected based on historical data and/or simulated data). In some implementations, the model fitting implements a least squares fitting technique, although the present disclosure contemplates any suitable model fitting technique.

At block 168, target placement model generation method 160 outputs a target placement model (or models) for the IC design layout, including parameters ($c_k$) that optimize target points placement. In some implementations, a target placement model is output for each IC pattern type (in other words, j=i). In some implementations, fewer target placement models are output than the number of IC pattern types (in other words, j<i), for example, where the same target placement model is output for different IC pattern types. In an example, the same target placement model may generate accurate predicted OPC contours for two IC pattern types, such as I-shaped patterns and L-shaped patterns, such that the same target placement model can be used for placing target points along contours corresponding with I-shaped patterns and L-shaped patterns. In some implementations, more target placement models are output than the number of IC pattern types (in other words, j>i), for example, where different target placement models are output for the same IC pattern type. In some implementations, a single target placement model is output for all IC patterns of the IC design layout (in other words, j=1). For example, a single target placement model can be output for a simple IC design layout, such as an IC design layout including one or more N×N arrays of IC patterns.

In some implementations, for the IC design layout having IC pattern 112, target placement model generation method 160 can output target placement models represented by:

$$F_1(x) = \sum_{A}^{a} c_A f_A(x) = c_1 f_1(x) + c_2 f_2(x) + \ldots + c_a f_a(x) \quad \text{TargetPlacementModelA}$$

$$F_2(x) = \sum_{B}^{b} c_B f_B(x) = c_1 f_1(x) + c_2 f_2(x) + \ldots + c_b f_b(x) \quad \text{TargetPlacementModelB}$$

$$F_3(x) = \sum_{C}^{d} c_C f_C(x) = c_1 f_1(x) + c_2 f_2(x) + \ldots + c_d f_d(x) \quad \text{TargetPlacementModelC}$$

where Target Placement Model A is used for placing target points along segments classified as segment type 132A, Target Placement Model B is used for placing target points along segments classified as segment type 132B, and Target Placement Model C is used for placing target points along segments classified as segment type 132C. Model A parameters (A), Model B parameters (B), and Model C parameters (C) can be defined respectively for Target Placement Model A, Target Placement Model B, and Target Placement Model C, where A, B, and C are integers from 1 to a, b, and d, respectively (in other words, A=1, 2, . . . , a; B=1, 2, . . . , b; and C=1, 2, . . . , d). In some implementations, a, b, and/or d are equal to the number of model parameters (k) defined at block 163 (for example, a, b, and/or d=k). In some implementations, a, b, and/or d are less than the number of parameters (k) defined at block 163, where the parameters used for Target Placement Model A, Target Placement Model B, and Target Placement Model C are selected from the parameters defined at block 163. In some implementations, Target Placement Model A, Target Placement Model B, and/or Target Placement Model C utilize the same parameters. In some implementations, Target Placement Model A, Target Placement Model B, and/or Target Placement Model C use different parameters. As noted, in some implementations, the same model can be implemented for different IC pattern types. For example, the same model may generate accurate OPC contours for two segment types, such as segment type 132B and segment type 132C, such that the same target placement model can be used for placing target points of segments classified as either segment type (for example, Target Placement Model B can be used for both segment type 132B and segment type 132C). As further noted, in some implementations, more than one model can be implemented for the same pattern type. For example, Target Placement Model B and Target Placement Model C can be used for placing target points along contours of segment type 132B.

Turning again to FIG. 2, at block 150, FIG. 3D is a schematic diagrammatic top view of an IC pattern, such as IC pattern 112, after undergoing a target placement process according to various aspects of the present disclosure. In FIG. 3D, target points are placed along rule-biased contour 142 using more than one target placement model, though the present disclosure contemplates implementations where the target points are placed along target contour 114. Since IC pattern 112 has been classified by segment ID, target points 152A are generated along rule-biased contour 142 at segment 124A and segment 124E based on Target Placement Model A (which optimizes and customizes target placement for segment type 132A), target points 152B are generated along rule-biased contour 142 at segment 124B, segment 124D, segment 124F, and segment 124H based on Target Placement Model B (which optimizes and customizes target placement for segment type 132B), and target points 152C are generated along rule-biased contour 142 at segment 124C and segment 124G based on Target Placement Model C (which optimizes and customizes target placement for segment type 132B). In some implementations, target points 152A, target points 152B, and/or target points 152C can further be generated based on a target placement rule and/or other target placement model in addition to Target Placement Model A, Target Placement Model B, and Target Placement Model C, respectively.

At block 170, computational lithography method 100 proceeds with performing an optical proximity correction (OPC) on the IC design layout based on the classification, thereby generating an OPCed IC design layout (also referred to as a modified IC design layout). OPC modifies (such as resizes, reshapes, and/or repositions) a shape of the at least one IC pattern according to models (referred to as model-based OPC) and/or rules (referred to as rule-based OPC), such that after a lithography process, a final wafer pattern exhibits enhanced resolution and precision. In particular, OPC modifies a contour corresponding with the IC pattern, such as target contour 114 or rule-biased contour 142, thereby generating an OPC contour. FIG. 3E is a schematic diagrammatic top view of an IC pattern, such as IC pattern 112, after undergoing an OPC process according to various aspects of the present disclosure. In FIG. 3E, OPC modifies a contour corresponding with the IC pattern, such as target contour 114 or rule-biased contour 142, thereby generating an OPC contour 162. In particular, OPC shifts a relative position of segments 124A-124H (for example, positively or negatively biased independently).

Each IC pattern type has at least one corresponding OPC rule and at least one corresponding OPC model, such that a contour corresponding with the IC pattern type is modified according to its corresponding OPC rule and/or OPC model. Rule-based OPC biases segments of the at least one IC pattern according to a set of pre-defined OPC rules for the IC pattern type (in some implementations, depending on a size and/or environment of the segments). In contrast, model-based OPC biases segments based on a deviation at target points between the target contour and a predicted IC contour for the IC pattern type (generated, for example, by simulating a lithography process based on an OPC model for the IC pattern type that exposes a mask having a mask pattern including the IC pattern, where an image of the mask pattern is transferred to a wafer (projected wafer image 50)). Turning again to FIG. 3E, Segment ID Type A, Segment ID Type B, and Segment ID Type C each have at least one corresponding OPC rule and at least one corresponding OPC model, such that segment types 132A-132C of target contour 114 or rule-biased contour 142 are biased according to an OPC rule and/or OPC model specific respectively to segments 132A-132C. In such implementations, OPC biases segment 124A and segment 124E using an OPC rule and/or OPC model specific to segment type 132A; OPC biases segment 124B, segment 124D, segment 124F, and segment 124H using an OPC rule and/or OPC model specific to segment type 132B; and OPC biases segment 124C and segment 124G using an OPC rule and/or OPC model specific to segment type 132C. By performing OPC using OPC rules and/or OPC models specific to the particular IC pattern type(s), computational lithography method 100 individually considers environments (including optical related behaviors and/or resist related behaviors) for each IC pattern type, such that OPC contours are optimally generated for each IC pattern type. In some implementations, OPC can add assistant features (AFs), such as scattering bars, serifs, and/or hammerheads, to an IC pattern. In some implementations, OPC distorts the IC pattern to balance image intensity, for example, removing portions of the IC pattern to reduce over-exposed regions and adding AFs to the IC pattern to enhance under-exposed regions. In some implementations, AFs compensate for line width differences that arise from different densities of surrounding geometries. In some implementations, AFs can prevent line end shortening and/or line end rounding. In some implementations, OPC can further modify the IC pattern to correct for e-beam proximity effects and/or perform other optimization features.

In some implementations, OPC can implement one or more OPC model(s) for an IC design layout that weights target placement models used for generating the target points for the IC design layout. In some implementations, the OPC model can include a target placement model weighting function G(x) represented by:

$$G(x) = \sum_{i}^{z} r_i F_i(x) = r_1 F_1(x) + r_2 F_2(x) + \ldots + r_z F_z(x)$$

where $F_i(x)$ represents a target placement model, $r_i$ represents a weighting parameter associated with the target placement model, z is a number of target placement models used for placing target points in the IC design layout, and i is an integer (for example, i=1, 2, . . . , z). The target placement model weighting function can prioritize one target placement model over another using the weighting parameters L. As an example, for IC pattern 112, the OPC model can include a target placement model weighting function G(x) represented by:

$$G(x) = \sum_{i}^{3} r_i F_i(x) = r_1 F_1(x) + r_2 F_2(x) + .r_3 F_3(x)$$

where target placement model $F_1(x)$, target placement model $F_2(x)$, and target placement model $F_3(x)$ are weighted relative to one another. OPC can also select an OPC model (or models) for IC design layout based on the classification of the at least one IC pattern. In some implementations, a different OPC model is implemented for each IC pattern type of the IC design layout. For example, segments 124A-124H can be modified based on OPC model corresponding with segment types 132A-132C, where each segment type 132A-132C is associated with a different OPC model. In such implementations, the same OPC model may be used for two IC pattern types of the IC design layout. For example, the same OPC model can be used for performing OPC on segment type 132B and segment type 132C. In some implementations, a single OPC model is implemented for all IC patterns of the IC design layout. For example, a single OPC model can be output for a simple IC design layout.

At block 180, computational lithography method 100 proceeds with simulating a lithography process using the OPCed IC design layout. For example, the lithography process simulation predicts a contour of an IC pattern imaged on a wafer (referred to as the predicted IC contour) by exposing a mask that includes a mask pattern having the OPC contour, such as OPC contour 162 of IC pattern 112, given predicted lithographic process conditions. The lithography process simulation can be performed using various LPC models (or rules), which may be derived from actual (historic) processing data associated with IC fab 25 fabricating IC devices. The processing data can include processing conditions associated with various processes of the IC manufacturing cycle, conditions associated with tools used for manufacturing the IC, and/or other aspects of the manufacturing process. The lithography process simulation takes into account various factors, such as image contrast, depth of focus, mask error sensitivity, other suitable factors, or combinations thereof. In some implementations, mask data preparation 40 can implement LPC process 44 to generate the predicted IC contour at block 180.

Computational lithography method 100 then proceeds to block 185 with comparing the predicted contour to the target contour (or the rule-biased contour). Such process is sometimes referred to as an OPC evaluation. For example, computational lithography method 100 evaluates a deviation between the predicted IC contour and the target points, such as target points 152A, target points 152B, and target points 152C associated with IC pattern 112, to determine whether the predicted IC contour matches the target contour (or the rule-biased contour), thereby passing the OPC evaluation. In some implementations, the predicted IC contour matches the target contour (or rule-biased contour) when distances between the predicted IC contour and the target points meet a threshold distance criteria, such as a range of distances defined between the predicted IC contour and the target points that are considered acceptable. In some implementations, computational lithography method 100 aims to minimize a cost function that defines a variance between the predicted contour and the target points, such as an edge placement error (EPE). If the predicted IC contour matches the target contour (or rule-biased contour), computational lithography method 100 can proceed to block 190. In some implementations, before proceeding to block 190, computational lithography method 100 stores (saves) the OPCed IC design layout, for example, as a one or more data files having information of the OPCed IC patterns. In some implementations, mask data preparation 40 can further implement an MRC process that checks the OPCed design layout, where the MRC process uses a set of mask creation rules. The mask creation rules can define geometric restrictions and/or connectivity restrictions to avoid various issues and/or failures that can arise from variations in IC manufacturing processes. If the predicted IC contour does not match the target contour (or rule-biased contour), computational lithography method 100 returns to block 170 to perform another OPC on the OPCed IC design layout. Accordingly, block 170, block 180, and block 185 are iterative processes, where multiple iterations (for example, modifications and simulations) are performed to generate the OPCed IC design layout. In some implementations, block 170, block 180, and block 185 modifies a contour of the IC pattern until distances between the target points and the predicted contour fall within an acceptable distance range.

By considering IC pattern type, particularly an environment in which an IC pattern resides, computational lithography method 100 optimizes target placement and OPC for IC design layouts. For example, an IC design layout often includes many different IC pattern types (all of which are formed on a same lithography layer, such as a resist layer), where each IC pattern type behaves differently depending on its environment, such that a single target placement rule, a single target placement model, a single OPC rule, and/or a single OPC model may not adequately place targets for all IC pattern types, particularly where optical related behaviors and resist related behaviors can vary significantly in complex environments. This can lead to increased time for generating OPC contours (for example, more iterations are required to match the predicted contour with the target points). Since computational lithography method 100 implements a multi-model technique, where the target placement model and/or the OPC model are optimized for each IC pattern, computational lithography method 100 can significantly decrease mask optimization time. Different embodiments disclosed herein offer different advantages and no particular advantage is necessarily required in all embodiments.

At block 190, computational lithography method 100 can proceed with fabricating a mask using the OPCed IC design layout, where the mask includes a mask pattern(s) that corresponds with the OPCed IC pattern(s). For example, a contour of the mask pattern corresponds with the OPC contour of the IC pattern (for example, OPC contour 172 of IC pattern 112). The mask includes a mask substrate and a patterned mask layer, which is designed based on various mask technologies. For example, mask house 20 of IC manufacturing system 10 can implement a mask making process, described in detail above with reference to FIG. 1, using the OPCed IC design layout to form the patterned mask layer. In some implementations, an e-beam lithography system (also referred to as an e-beam writer or an e-beam writer system) performs an e-beam lithography process to pattern a mask with a final mask pattern, where the final mask pattern corresponds with the OPCed IC pattern. The e-beam lithography process can include forming an e-beam sensitive resist layer over a mask material layer, and exposing the e-beam sensitive resist layer by scanning an e-beam across the e-beam sensitive resist layer based on a mask shot map. During the exposing process, a dose and/or shape of each e-beam exposure shot (mask shot) for forming respective mask features can be tuned based on the mask shot map. Exposed portions of the e-beam sensitive resist layer chemically change, enabling selective removal of exposed or non-exposed portions of the e-beam sensitive resist layer during a developing process, and thereby forming a patterned e-beam sensitive resist layer. The e-beam lithography process can further include performing an etching process that uses the patterned e-beam sensitive resist layer as an etch mask to remove portions of the mask material layer (such as an opaque layer, a phase shifting material layer, an absorption layer, or a portion of a mask substrate), thereby forming a final mask pattern in the mask material layer by transferring a pattern defined in the patterned e-beam sensitive resist layer to the mask material layer. The patterned e-beam sensitive resist layer can then be removed, for example, by a resist stripping process. Alternatively, in some implementations, the e-beam lithography process directly writes the final mask pattern to the mask material layer based on the mask shot map, omitting the processing involved with the e-beam sensitive resist layer.

Figure 6:
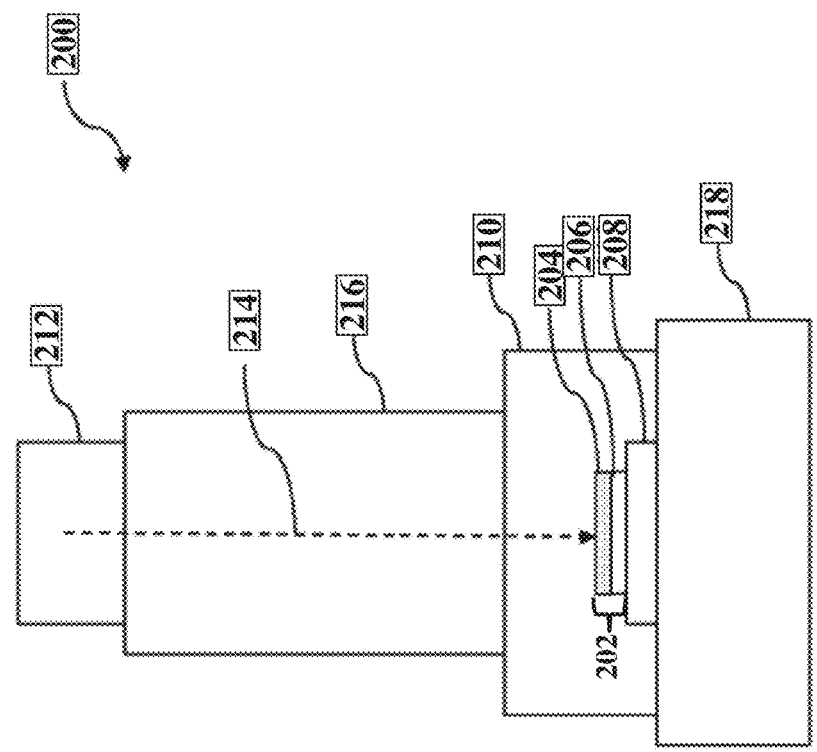
FIG. 6 is a simplified block diagram of an electron-beam writer according to various aspects of the present disclosure.

FIG. 6 is a simplified block diagram of an e-beam writer 200, which can be implemented for fabricating masks at block 190, according to various aspects of the present disclosure. E-beam writer 200 can fabricate a mask 202 by writing an IC pattern on an e-beam sensitive resist layer 204 formed on a mask substrate 206. In some implementations, e-beam writer 200 receives a mask shot map in the form of a pattern writing instruction set (for example, from a pattern generator). In FIG. 6, mask 202 is positioned on a stage 208 within a chamber 210. An e-beam source 212 generates an electron beam(s) 214. In some implementations, e-beam source 212 is an electron gun with an electron generating mechanism (for example, thermal electron emission). In a particular example, the electron gun includes a tungsten (or other suitable material) filament designed and biased to thermally emit electrons. Electron beam 214 is directed and positioned on mask 202 (in particular, e-beam sensitive resist layer 204) by an e-beam column 216. In some implementations, e-beam column 216 includes lenses for focusing electrons generated by e-beam source 212 to achieve desired imaging effect (for example, electrostatic lenses and/or electromagnetic lenses), apertures for defining a shape and/or distribution of electron beam 214, a deflection system for scanning electron beam 214 across mask 202 (for example, in a vector mode or a raster mode), and other e-beam column components. In some implementations, e-beam source 212 is considered a portion of e-beam column 216. In some implementations, the deflection system is a scanner that magnetically (for example, using conductive coils) or electrostatically (for example, using conductive plates) deflects electron beam 214 in two orthogonal directions, such that electron beam 214 is scanned over a surface of mask 202, such as a surface of e-beam sensitive resist layer 204. A pump unit 218 can generate a vacuum environment or other suitable environment in chamber 210 during an e-beam lithography process. FIG. 6 has been simplified for the sake of clarity to better understand the inventive concepts of the present disclosure. Additional features can be added in e-beam writer 200, and some of the features described below can be replaced or eliminated for additional embodiments of e-beam writer 200.

Turning again to FIG. 2, other processing steps may follow after fabricating the mask. For example, at block 195, computational lithography method 100 can proceed with fabricating a wafer using the mask. For example, IC fab 25 of IC manufacturing system 10 can implement a wafer making process, described in detail above with reference to FIG. 1, using the mask to form a patterned wafer material layer. In some implementations, a lithography system performs a lithography process to pattern a wafer material layer with a final wafer pattern, where the final wafer pattern corresponds with the target pattern of the IC design layout. The lithography process can include forming a resist layer on the wafer material layer (for example, by spin coating), and exposing the resist layer by illuminating a mask (such as the mask fabricated at block 190). During the exposure process, illumination source optics are configured to illuminate the mask with radiation energy (such as UV light, DUV light, or EUV light). Various components of the lithography system can be tuned to configure the illumination source optics as defined by an illumination source map. The mask blocks radiation from and/or transmits radiation to the resist layer depending on a type of the mask (for example, binary mask, phase shift mask, or EUV mask), a final mask pattern of the mask, and the illumination source optics used to illuminate the mask with the radiation energy, such that an image is projected onto the resist layer that corresponds with the final mask pattern. Exposed portions of the resist layer chemically change, enabling selective removal of exposed or non-exposed portions of the resist layer during a developing process, and thereby forming a patterned resist layer. The lithography process can further include performing an etching process that uses the patterned resist layer as an etch mask to remove portions of the wafer material layer (such as a dielectric material layer, a semiconductor material layer, a conductive material layer, or a portion of a wafer substrate), thereby forming a final wafer pattern in the wafer material layer by transferring a pattern defined in the patterned resist layer to the wafer material layer. The patterned resist layer can then be removed, for example, by a resist stripping process.

Figure 7:
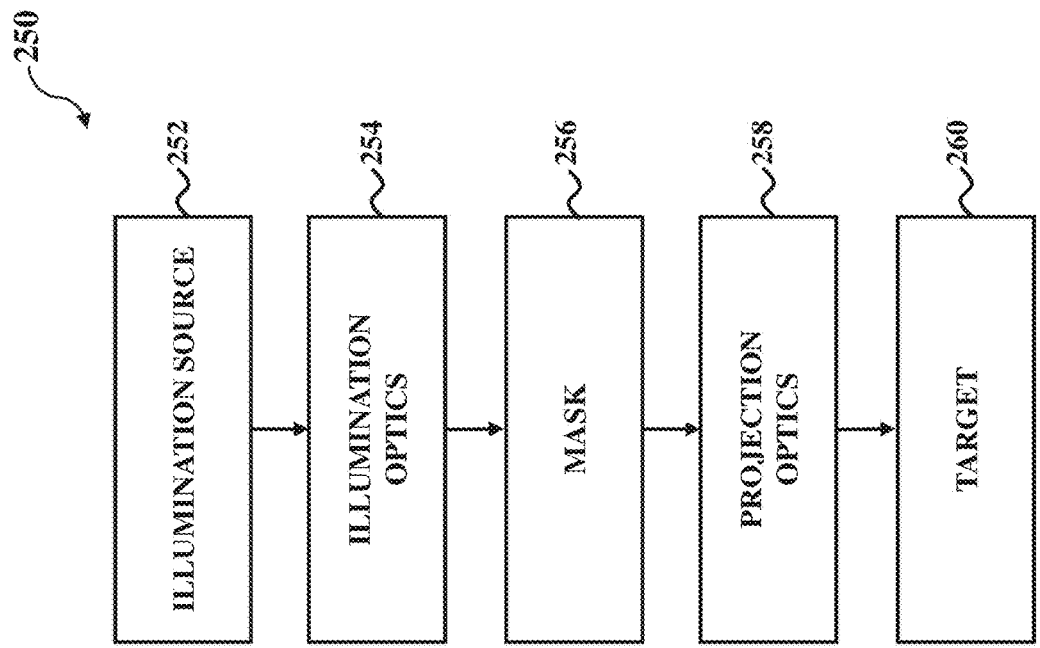
FIG. 7 is a simplified block diagram of a lithography system according to various aspects of the present disclosure.

FIG. 7 is a simplified block diagram of an optical lithography system 250 for imaging a pattern of a mask onto a workpiece, which can be implemented by IC fab 25, according to various aspects of the present disclosure. The workpiece includes a wafer, a mask, or any base material on which processing is conducted to produce layers of material configured to form IC patterns and/or IC features. In some implementations, the workpiece is a wafer having a radiation sensitive layer (for example, a resist layer) disposed thereover. In FIG. 7, optical lithography system 250 includes an illumination source module 252, an illumination optics module 254, a mask module 256, a projection optics module 258, and a target module 260. Illumination source module 252 includes a radiation source that generates and emits radiation (light) of a suitable wavelength, such as UV radiation, DUV radiation, EUV radiation, other suitable radiation, or a combination thereof. Illumination optics module 254 collects, guides, and directs the radiation, such that the radiation is projected onto a mask. Mask module 256 includes a mask stage for holding the mask and manipulating a position of the mask. The mask transmits, absorbs, and/or reflects the radiation depending on a final mask pattern of the mask, along with mask technologies used to fabricate the mask, thereby projecting patterned radiation. Projection optics module 258 collects, guides, and directs the patterned radiation from mask module 256 to a workpiece of target module 260, such that an image of the mask (corresponding with the final mask pattern) is projected onto the workpiece. Target module 260 can include a wafer stage for holding the workpiece and manipulating a position of the workpiece. In some implementations, target module 260 provides control of a position of the workpiece, such that an image of the mask can be scanned onto the workpiece in a repetitive fashion (though other scanning methods are possible). In some implementations, illumination optics module 254 includes various optical components for collecting, directing, and shaping the radiation onto the mask, and projection optics module 258 includes various optical components for collecting, directing, and shaping the patterned radiation onto the workpiece. Such optical components include refractive components, reflective components, magnetic components, electromagnetic components, electrostatic components, and/or other types of components for collecting, directing, and shaping the radiation. FIG. 7 has been simplified for the sake of clarity to better understand the inventive concepts of the present disclosure. Additional features can be added in optical lithography system 250, and some of the features described below can be replaced, modified, or eliminated for additional embodiments of optical lithography system 250.

Figure 8:
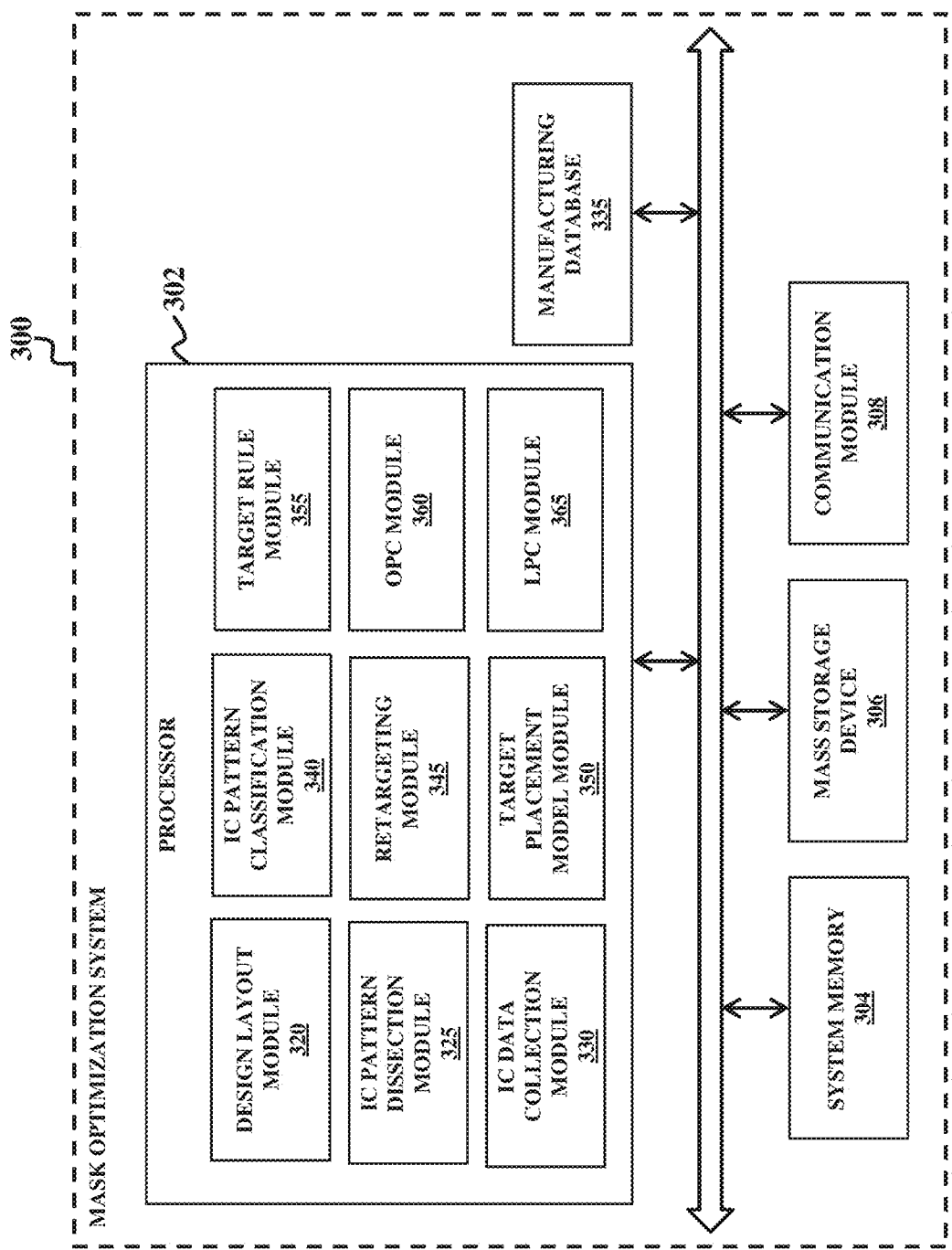
FIG. 8 is a simplified block diagram of a mask optimization system, which can be implemented by IC manufacturing system 10 of FIG. 1, according to various aspects of the present disclosure.

FIG. 8 is a simplified block diagram of a mask optimization system 300, which can be implemented by IC manufacturing system 10 of FIG. 1, according to various aspects of the present disclosure. In some implementations, mask house 20 implements mask optimization system 300, where mask optimization system 300 is operable to perform functionalities described in association with mask data preparation 40 of FIG. 1. Mask optimization system 300 includes both hardware and software integrated to perform various operations and/or functions for performing computational lithography techniques, as described herein. In some implementations, computational lithography method 100 of FIG. 2 and/or target placement model generation method 160 of FIG. 5 may be implemented as software instructions executing on mask optimization system 300, such that mask optimization system 300 can optimize placement of target points based on IC pattern types, thereby optimizing OPCed IC design layouts. FIG. 8 has been simplified for the sake of clarity to better understand the inventive concepts of the present disclosure. Additional features can be added in mask optimization system 300, and some of the features described below can be replaced or eliminated for additional embodiments of mask optimization system 300.

Mask optimization system 300 includes a processor 302 that is communicatively coupled to a system memory 304, a mass storage device 306, and a communication module 308. System memory 304 provides processor 302 with non-transitory, computer-readable storage to facilitate execution of computer instructions by processor 302. Examples of system memory 304 include random access memory (RAM) devices, such as dynamic RAM (DRAM), synchronous DRAM (SDRAM), solid state memory devices, and/or a variety of other memory devices. Computer programs, instructions, and data are stored on mass storage device 306. Examples of mass storage device 306 include hard discs, optical disks, magneto-optical discs, solid-state storage devices, and/or a variety of other mass storage devices. Communication module 308 is operable to communicate information with various components of IC manufacturing entities, such as design house 15, mask house 20, and IC fab 25 of IC manufacturing system 10. In FIG. 6, communication module 308 allows mask optimization system 300 to communicate with a mask making system (such as an e-beam lithography system) and a wafer making system (such as an optical lithography system). Communication module 308 includes Ethernet cards, 802.11 WiFi devices, cellular data radios, and/or other communication devices for facilitating communication of mask optimization system 300 with IC manufacturing entities.

Mask optimization system 300 further includes an IC design layout module 320, an IC pattern dissection module 325, an IC data collection module 330, an IC manufacturing database 335, an IC pattern classification module 340, a retargeting module 345, a target placement model module 350, a target placement rule module 355, an OPC module 360, and an LPC module 365, which are communicatively coupled to carry out a mask optimization process (such as computational lithography method 100). In operation, IC design layout module 320 receives an IC design layout that defines a target pattern (for example, from design house 15) and prepares the IC design layout for a mask optimization process. IC data collection module 330 is configured to collect, store, and maintain IC manufacturing data, such as data from mask making processes associated with mask house 20 and wafer making processes associated with IC fab 25. The IC manufacturing data can be stored in IC manufacturing database 335. In some implementations, IC data collection module 330 analyzes the collected IC manufacturing data. In some implementations, analyzing the collected IC manufacturing data can include filtering out low quality IC manufacturing data (such as data deemed not reliable) and/or consolidating the manufacturing data into useful statistical IC manufacturing information (such as averaging). In some implementations, for illustration purposes only, the collected IC manufacturing data includes e-beam blur information, resist characteristic information (such as CDs associated with resist patterns after developing processes), etching bias information (such as CDs of wafer patterns after etching processes), and/or other useful IC manufacturing data. In some implementations, the collected IC manufacturing data includes OPC data, such as OPC contours generated during mask optimization process, where the OPC contours can be evaluated to determine expected OPC contours for particular IC pattern types.

IC pattern classification module 340 is configured to classify IC patterns of the IC design layout, such as described above with reference to block 130 of computational lithography method 100. Retargeting module 345 is configured to generate rule-biased contours of the IC patterns of the IC design layout, such as described above with reference to block 140 of computational lithography method 100. Target placement model module 350 is configured to generate target placement models based on IC pattern type, and target placement rule module 355 is configured to generate target placement rules based on IC pattern type. Target placement model module 350 and/or target placement rule module 355 can use IC manufacturing data to generate the target placement models, such as that stored by IC manufacturing database 335. Target placement model module 350 and/or target placement rule module 355 can store the target placement models in a storage component, such as database (not shown). In some implementations, target placement model module 350 performs various operations of computational lithography method 100, such as those described with reference to block 150, to optimize placement of target points. OPC module 360 is configured to generate an OPCed IC design layout using target points generated by target placement module 350 and/or target rule placement module 355, such as described above with reference to block 170 of computational lithography method 100. OPC module 360 is also configured to generate OPC rules and/or OPC models based on IC pattern type. OPC module 360 can use IC manufacturing data to generate the OPC rules and/or OPC models, such as that stored by IC manufacturing database 335. OPC module 360 can store the OPC rules and/or OPC models in a storage component, such as database (not shown). LPC module 365 is configured to generate predicted contours of IC patterns of the IC design layout based on the OPCed IC design layout, such as described above with reference to block 180 of computational lithography method 100. In some implementations, mask optimization system 300 further includes a mask fracturing module (not shown) that is configured to generate a mask shot map based on a mask pattern defined by the OPCed IC design layout (which corresponds with an optimized target contour), for example, by fracturing the OPCed IC patterns into mask regions (mask polygons) as described herein. The mask shot map defines exposure information, such as an exposure dose, for each mask region. In alternative implementations, the mask fracturing module can be eliminated, such that mask optimization system 300 generates the mask shot map for direct use by mask house 20.

Various mask optimization methods are disclosed herein for enhancing lithography printability. An exemplary mask optimization method includes receiving an integrated circuit (IC) design layout having an IC pattern; generating target points for a contour corresponding with the IC pattern based on a target placement model, wherein the target placement model is selected based on a classification of the IC pattern; and performing an optical proximity correction (OPC) on the IC pattern using the target points, thereby generating a modified IC design layout. In some implementations, the method further includes generating the target points for the contour based on a target placement rule. In some implementations, the method further includes generating a rule-biased contour of the IC pattern based on the classification of the IC pattern, wherein the target points are placed along the rule-biased contour. In some implementations, the method further includes fabricating a mask based on the modified IC design layout. In some implementations, performing the OPC on the IC pattern includes selecting an OPC model for the OPC based on the classification of the IC pattern.

In some implementations, the IC pattern is a first IC pattern, the target points are first target points, the contour is a first contour, and the target placement model is a first target placement model. In such implementations, the IC design layout can further include a second IC pattern, wherein the method further includes assigning second target points to a second contour corresponding with the second IC pattern based on a second target placement model, wherein the second target placement model is selected based on a classification of the second IC pattern, and further wherein the second IC pattern is different than the first IC pattern, wherein the OPC is further performed on the second IC pattern using the second target points. In such implementations, the first target placement model and the second target placement model can be different. In some implementations, the OPC weights first target placement model and the second placement model differently.

Another exemplary method includes receiving an integrated circuit (IC) design layout having a plurality of IC patterns; dissecting each of the plurality of IC patterns; classifying each of the plurality of IC patterns; for each of the plurality of IC patterns, generating target points for a contour corresponding with the IC pattern based on the classification of the IC pattern; and performing an optical proximity correction (OPC) on the IC design layout using the target points, thereby generating a modified IC design layout. In some implementations, the method further includes, for each of the plurality of IC patterns, generating a rule-biased contour of the IC pattern based on the classification of the IC pattern, wherein the target points are placed along the rule-biased contour. In some implementations, the method further includes fabricating a mask based on the modified IC design layout. In some implementations, the method further includes fabricating a wafer using the mask.

In some implementations, the target points are generated based on at least one of a target placement rule and a target placement model, wherein the target placement rule and the target placement model are selected based on the classification of the IC pattern. In such implementations, the target points for at least two IC patterns of the plurality of IC patterns can be generated using different target placement models, wherein the at least two IC patterns are different. In some implementations, the OPC uses an OPC model that weights the different target placement models. In some implementations, the target points for at least two IC patterns of the plurality of IC patterns are assigned using the same target placement model, wherein the at least two IC patterns are different.

An exemplary integrated circuit system includes a processor and a communication module communicatively coupled to the processor and configured to receive an IC design layout. The system also includes non-transitory, computer-readable storage communicatively coupled to the processor and including instructions executable by the processor. The instructions include instructions to generate target points for a contour corresponding with the IC pattern based on a target placement model, wherein the target placement model is selected based on a classification of the IC pattern, and instructions to perform an optical proximity correction (OPC) on the IC pattern using the target points, thereby generating a modified IC design layout. In some implementations, the instructions further include fabricating a mask based on the modified IC design layout. In some implementations, the instructions further include generating a rule-biased contour of the IC pattern based on the type of the IC pattern, wherein the target points are placed along the rule-biased contour. In some implementations, the instructions further include generating an OPC model that weights the target placement model.

Another exemplary method includes receiving an IC design layout that includes an IC pattern having a target contour; dissecting the target contour of the IC pattern into a plurality of segments; generating target points for the plurality of segments based a type of the IC pattern; performing, using the target points and the plurality of segments, an optical proximity correction (OPC) on the IC pattern to generate a modified contour of the IC pattern, wherein a modified IC design layout includes the IC pattern having the target contour; simulating a lithography process using the modified IC design layout that includes the IC pattern having the modified contour to generate a predicted contour; and storing the modified IC design layout having the IC pattern having the modified contour when the predicted contour matches the target contour within a threshold. In some implementations, the method further includes fabricating a mask based on the modified IC design layout. In some implementations, the method further includes generating a rule-biased contour of the IC pattern based on the type of the IC pattern, wherein the target points are placed along the rule-biased contour.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving an integrated circuit (IC) design layout having a plurality of IC patterns;
   for each IC pattern of the plurality of IC patterns, classifying the IC pattern according to a characteristic of the IC pattern, wherein the characteristic is selected from a plurality of characteristics, wherein each characteristic of the plurality of characteristics has a corresponding target placement model;
   for each IC pattern of the plurality of IC patterns, generating target points for the IC pattern based on a respective target placement model corresponding to the characteristic of the IC pattern; and
   for each IC pattern of the plurality of IC patterns, after generating the target points, performing an optical proximity correction (OPC) process on the IC pattern using the target points generated for the IC pattern, thereby generating a modified IC design layout.

2. The method of claim 1, wherein the respective target placement model predicts a location of a contour of the IC pattern after undergoing OPC.

3. The method of claim 1, wherein the characteristic is a shape of the IC pattern.

4. The method of claim 1, wherein the characteristic is a cell type to which the IC pattern belongs.

5. The method of claim 1, wherein the characteristic is a device type to which the IC pattern belongs.

6. The method of claim 1, wherein the characteristic is an IP block to which the IC pattern belongs.

7. The method of claim 1, wherein the characteristic is a segment type of the IC pattern.

8. The method of claim 1, further comprising dissecting each IC pattern of the plurality of IC patterns.

9. The method of claim 1, further comprising, for each IC pattern of the plurality of IC patterns, generating a rule-biased contour of the IC pattern based on the classifying of the IC pattern, wherein the target points are placed along the rule-biased contour.

10. The method of claim 1, wherein each characteristic of the plurality of characteristics has a different target placement model.

11. The method of claim 1, further comprising fabricating a mask using the modified IC design layout.

12. A method comprising:
receiving an integrated circuit (IC) design layout having a first IC pattern and a second IC pattern;
classifying the first IC pattern as a first IC pattern type, wherein the first IC pattern type corresponds to a first target placement model;
generating first target points for the first IC pattern based on the first target placement model;
classifying the second IC pattern as a second IC pattern type different from the first IC pattern type, wherein the second IC pattern type corresponds to a second target placement model different from the first target placement model;
generating second target points for the second IC pattern based on the second target placement model; and
after generating the first target points and the second target points, performing an optical proximity correction (OPC) process on the first IC pattern and the second IC pattern using the first target points and the second target points, respectively, thereby generating a modified IC design layout.

13. The method of claim 12, wherein the first target placement model predicts a first location of a first contour of the first IC pattern after undergoing OPC, and wherein the second target placement model predicts a second location of a second contour of the second IC pattern after undergoing OPC.

14. The method of claim 12, further comprising:
generating the first target points based on a first target placement rule, wherein the first IC pattern type corresponds to the first target placement rule; and
generating the second target points based on a second target placement rule different from the first target placement rule, wherein the second IC pattern type corresponds to the second target placement rule.

15. The method of claim 12, wherein the first IC pattern type and the second IC pattern type each indicate a respective IC pattern shape, wherein the respective IC pattern shape is hole-shaped, line-shaped, L-shaped, U-shaped, O-shaped, or T-shaped.

16. The method of claim 12, wherein the first IC pattern type and the second IC pattern type each indicate a respective cell type, wherein the respective cell type is a core cell, a scan cell, an input/output cell, or a memory cell.

17. The method of claim 12, wherein the first IC pattern type and the second IC pattern type each indicate a respective device type, wherein the respective device type is a static random-access memory (SRAM), a standard cell, or a seal ring.

18. The method of claim 12, wherein the first IC pattern type and the second IC pattern type each indicate a respective IP block, wherein the respective IP block is a first IP block, a second IP block different from the first IP block, or no IP block.

19. An integrated circuit (IC) system, comprising:
a processor;
a communication module communicatively coupled to the processor and configured to receive an IC design layout having a plurality of IC patterns; and
a non-transitory, computer-readable storage communicatively coupled to the processor and including instructions executable by the processor, the instructions for:
for each IC pattern of the plurality of IC patterns, classifying the IC pattern according to a characteristic of the IC pattern, wherein the characteristic is selected from a plurality of characteristics, wherein each characteristic of the plurality of characteristics has a corresponding target placement model,
for each IC pattern of the plurality of IC patterns, generating target points for the IC pattern based on a respective target placement model corresponding to the characteristic of the IC pattern, and
for each IC pattern of the plurality of IC patterns, after generating the target points, performing an optical proximity correction (OPC) process on the IC pattern using the target points generated for the IC pattern, thereby generating a modified IC design layout.

20. The IC system of claim 19, wherein the plurality of characteristics are IC pattern shapes, segment types, cell types, device types, or IP block types.

\* \* \* \* \*